US012490486B2

United States Patent
Ouchi et al.

(10) Patent No.: US 12,490,486 B2
(45) Date of Patent: Dec. 2, 2025

(54) COMPOUND SEMICONDUCTOR SUBSTRATE AND METHOD FOR MANUFACTURING COMPOUND SEMICONDUCTOR SUBSTRATE

(71) Applicant: AIR WATER INC., Osaka (JP)

(72) Inventors: Sumito Ouchi, Azumino (JP); Keisuke Kawamura, Azumino (JP)

(73) Assignee: Air Water Inc., Osaka (JP)

( * ) Notice: Subject to any disclaimer, the term of this patent is extended or adjusted under 35 U.S.C. 154(b) by 422 days.

(21) Appl. No.: 18/016,177

(22) PCT Filed: Jul. 13, 2021

(86) PCT No.: PCT/JP2021/026297
§ 371 (c)(1),
(2) Date: Jan. 13, 2023

(87) PCT Pub. No.: WO2022/014592
PCT Pub. Date: Jan. 20, 2022

(65) Prior Publication Data
US 2023/0215922 A1    Jul. 6, 2023

(30) Foreign Application Priority Data
Jul. 15, 2020    (JP) ................................. 2020-121743

(51) Int. Cl.
*H01L 21/00*    (2006.01)
*H10D 30/01*    (2025.01)
(Continued)

(52) U.S. Cl.
CPC ....... *H10D 62/8503* (2025.01); *H10D 30/015* (2025.01); *H10D 30/475* (2025.01); *H10D 62/824* (2025.01); *H10D 62/8325* (2025.01)

(58) Field of Classification Search
CPC ............... H10D 30/475; H10D 30/015; H01L 21/02458; H01L 21/02505; H01L 21/0254; H01L 21/02579; H01L 21/0262
See application file for complete search history.

(56) References Cited

U.S. PATENT DOCUMENTS

| 2016/0308039 A1* | 10/2016 | Saito .............. H01L 21/02458 |
| 2017/0077242 A1 | 3/2017 | Lutgen et al. |
| 2020/0020778 A1* | 1/2020 | Narukawa ......... H01L 21/02458 |

FOREIGN PATENT DOCUMENTS

| JP | 2015-019052 A | 1/2015 |
| JP | 2016-207748 A | 12/2016 |

(Continued)

OTHER PUBLICATIONS

International Search Report, mailed Oct. 5, 2021 in International Appln. No. PCT/JP2021/026297.

(Continued)

*Primary Examiner* — Reema Patel
(74) *Attorney, Agent, or Firm* — Wood, Phillips, Katz, Clark & Mortimer

(57) ABSTRACT

A compound semiconductor substrate and a method for manufacturing the compound semiconductor substrate including the steps of forming an electronic traveling layer consisting of a first nitride semiconductor, forming a barrier layer consisting of a second nitride semiconductor with a wider band gap than a band gap of the first nitride semiconductor on the electronic traveling layer, and forming a cap layer with an organometallic vapor phase epitaxy on the barrier layer and in contact with the barrier layer. The cap layer has a C concentration of $5*10^{17}$ atoms/cm$^3$ or more and $1*10^{20}$ atoms/cm$^3$ or less, and consists of a nitride semiconductor. During the step forming the cap layer, source gas of the nitride semiconductor forming the cap layer and (Continued)

hydrocarbon gas are introduced to a top surface of the barrier layer.

8 Claims, 17 Drawing Sheets

(51) Int. Cl.
    *H10D 30/47*     (2025.01)
    *H10D 62/824*     (2025.01)
    *H10D 62/832*     (2025.01)
    *H10D 62/85*     (2025.01)

(56) References Cited

FOREIGN PATENT DOCUMENTS

| | | | | |
|---|---|---|---|---|
| JP | 2018-082121 | A | 5/2018 | |
| JP | 2018-174234 | A | 11/2018 | |
| JP | 2018-200934 | A | 12/2018 | |
| JP | 2019-102767 | A | 6/2019 | |
| WO | WO-2018180312 | A1 * | 10/2018 | ....... H01L 21/02381 |

OTHER PUBLICATIONS

Office Action issued May 21, 2024, in Japanese Patent Application No. 2020-121743.
International Preliminary Report on Patentability and Written Opinion of the International Searching Authority, Issued Jan. 17, 2023 in International Patent Application No. PCT/JP2021/026297.

\* cited by examiner

FIG. 14

| SAMPLE | SAMPLE 1 (INVENTION) | SAMPLE 2 (COMPARATIVE) | SAMPLE 3 (COMPARATIVE) |
|---|---|---|---|
| STRUCTURE & GROW TEMP | C-GaN CAP L. 1030°C / AlGaN BARRIER L. 1030°C / GaN E. TRAVEL L. / SUBSTRATE | u-GaN CAP L. 1030°C / AlGaN BARRIER L. 1030°C / GaN E. TRAVEL L. / SUBSTRATE | C-GaN CAP LAYER LESS THAN 800°C / AlGaN BARRIER L. 1030°C / GaN E. TRAVEL L. / SUBSTRATE |
| GaN CAP LAYER C CONCENTRATION (ATOMS/cm³) | $7 \times 10^{17}$ | $2 \times 10^{16}$ | $9 \times 10^{17}$ |
| REGION RG OF CAP LAYER RMS ROUGHNESS Rq (nm) | 0.8 | 1.0 | OVER 1.0 |
| GATE LEAKAGE (Ig) (A) | 2.9 | 53 | NO DATA |

FIG. 15
(a)
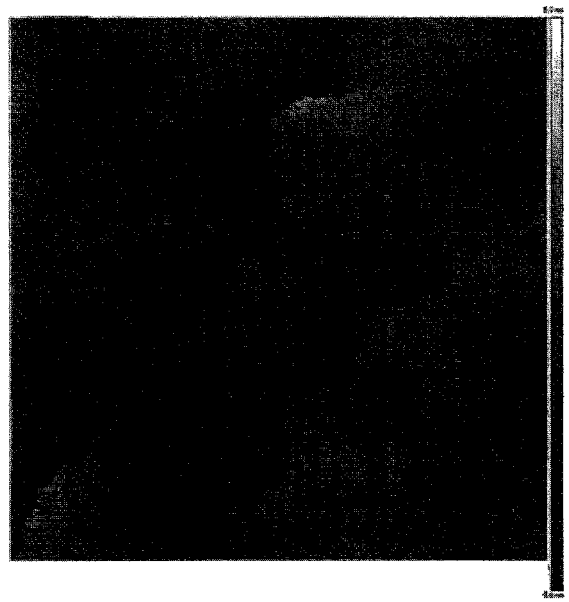
(b)
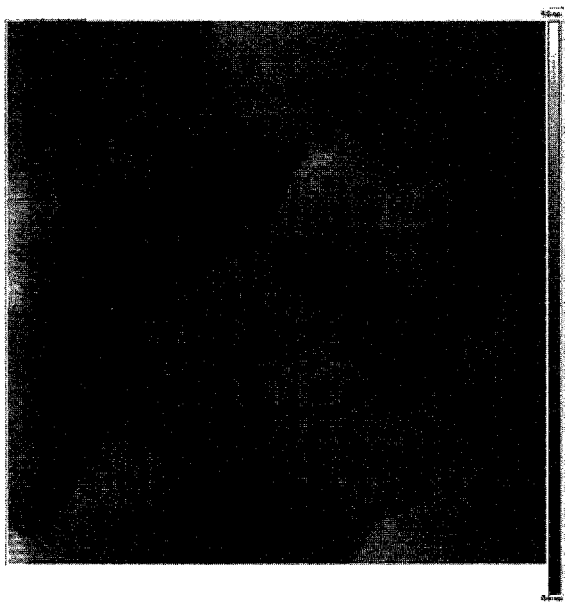

FIG. 19

| SAMPLE | SAMPLE 7 | SAMPLE 8 |
|---|---|---|
| C-GaN L. 51c CONCENTRATION ERROR $\Delta C$ | 0% | 258% |
| C-GaN L. 51b CONCENTRATION ERROR $\Delta C$ | 21% | 312% |
| C-GaN L. 51a CONCENTRATION ERROR $\Delta C$ | 33% | 448% |

FIG. 20

| SAMPLE | SAMPLE 7 | SAMPLE 8 |
|---|---|---|
| C-GaN L. 51c THICKNESS ERROR $\Delta W$ | 1.2% | 11% |
| C-GaN L. 51b THICKNESS ERROR $\Delta W$ | 1.8% | 11% |
| C-GaN L. 51a THICKNESS ERROR $\Delta W$ | 3.9% | 9% |

FIG. 21

| SAMPLE | SAMPLE 7 | | SAMPLE 8 | |
|---|---|---|---|---|
| POSITION | CENTER | EDGE | CENTER | EDGE |
| DEFECT DENSITY (DEFECTS/cm$^2$) | 1.8 | 1.8 | 207 | 7.1 |

COMPOUND SEMICONDUCTOR SUBSTRATE AND METHOD FOR MANUFACTURING COMPOUND SEMICONDUCTOR SUBSTRATE

BACKGROUND OF THE INVENTION

Technological Field

The present invention relates to a compound semiconductor substrate and a method for manufacturing of a compound semiconductor substrate. More specifically, the present invention relates to a compound semiconductor substrate with an electronic traveling layer and a barrier layer and a method for manufacturing of such a compound semiconductor substrate.

Description of the Related Art

GaN (gallium nitride) is known as a wide band gap semiconductor material, which has a larger band gap and higher insulation breakdown field strength than Si (silicon). Since GaN has a higher dielectric breakdown resistance than other wide band gap semiconductor materials, it is expected to be applied to next-generation low-loss power devices.

A HEMT (High Electron Mobility Transistor, in which electrons has high mobility) made of nitride semiconductors such as GaN and AlGaN (aluminum nitride gallium) is attracting attention as a key technology for next-generation low-loss power devices. Technologies of HEMTs made of nitride semiconductors has developed rapidly in recent years.

A HEMT consisting of nitride semiconductors includes an electronic traveling layer consisting of a first nitride semiconductor and barrier layer consisting of a second nitride semiconductor formed on the electronic traveling layer. The second nitride semiconductor has a wider band gap than the band gap of the first nitride semiconductor. In the HEMT consisting of nitride semiconductors, two-dimensional electron gas is formed at the electronic traveling layer near the boundary face with the barrier layer. This two-dimensional electron gas is used for the HEMT operation. A HEMT consisting of nitride semiconductors can generate two-dimensional electron gas approximately ten times as large as the electrical field effect transistor made of GaAs-based semiconductor material, and has a large current density. Therefore, a HEMT consisting of nitride semiconductors is expected to operate at high output and high efficiency, and is expected as a next-generation high-output amplifier. Also, insulation breakdown voltage of GaAs is 0.4 MV/cm, while insulation breakdown voltage of GaN is 3.0 MV/cm. GaN has a high insulation breakdown voltage of about 7.5 times that of GaAs. This fact is also one of the reasons why a HEMT consisting of nitride semiconductors is expected as a next-generation high-output amplifier.

FIG. 22 is a cross-sectional view schematically showing a configuration of a conventional HEMT 1010 consisting of nitride semiconductors.

Referring to FIG. 22, conventional HEMT 1010 includes substrate 1001, buffer layer 1002, electronic traveling layer 1003, barrier layer 1004, source electrode 1005, drain electrode 1006, gate electrode 1007, and passivation layer 1008. On substrate 1001, buffer layer 1002, electronic traveling layer 1003, and barrier layer 1004 are stacked in this order. On barrier layer 1004, each of source electrode 1005, drain electrode 1006, and gate electrode 1007 are provided spaced apart from each other. Gate electrode 1007 is provided between source electrode 1005 and drain electrode 1006. The passivation layer 1008 is provided at positions where source electrode 1005, drain electrode 1006, and gate electrode 1007 are not formed on barrier layer 1004. Source electrode 1005, drain electrode 1006, gate electrode 1007 and passivation layer 1008 are in contact with barrier layer 1004.

Substrate 1001 consists of, for example, SiC (silicon carbide). Buffer layer 1002 is made of, for example, AlGaN. Electronic traveling layer 1003 is made of, for example, undoped GaN. Barrier layer 1004 is made of, for example, n-type AlGaN. Passivation layer 1008 is made of, for example, $SiO_2$ (silicon oxide) or SiN (silicon nitride).

In HEMT 1010, by applying a voltage between source electrode 1005 and drain electrode 1006, electrons move between source electrode 1005 and drain electrode 1006 via two-dimensional electron gas 1003a. The concentration of two-dimensional electron gas 1003a changes, based on the voltage applied to gate electrode 1007. For this reason, switching of current flowing between source electrode 1005 and drain electrode 1006 can be achieve by voltage applied to gate electrode 1007.

When conventional HEMT 1010 is used under high voltage, there was a problem caused by surface roughness of barrier layer 1004 (unevenness of top surface 1004a of barrier layer 1004). In particular, there was a problem of gate leakage (shown in the portion surrounded by dotted line X1 in FIG. 22). This problem is that the electric field concentrates at the portion of unevenness of top surface 1004a, and leakage current flows between gate electrode 1007, and source electrode 1005 or drain electrode 1006. The leakage current is a current that should not flow initially. Also, there is a problem that the current collapse degrades (shown in the portion surrounded by the dotted line X2 in FIG. 22). This problem is that electrons running in HEMT 1010 is trapped by crystal defects in HEMT 1010, and the ON-resistance of HEMT 1010 increases. Further, there was a problem that the reliability is low. That is, when the HEMT 1010 was energized for a long period of time, the HEMT sometimes broke down suddenly.

FIG. 23 is a cross-sectional view schematically showing a configuration of conventional HEMT 1020 consisting of nitride semiconductors.

Referring to FIG. 23, as a solution of the problem caused by surface roughness of the barrier layer, in conventional HEMT 1020, cap layer 1011 is placed on barrier layer 1004 so as to come into contact with barrier layer 1004. The cap layer 1011 has a thickness on the order of 1 nanometer to 10 nanometers. The flatness of the top surface 1011a of the cap layer 1011 is higher than the flatness of the top surface 1004a of the barrier layer 1004. For this reason, according to the HEMT 1020, the problem caused by the surface roughness of the barrier layer 1004 (especially the problem of gate leakage) can be improved to some extent. However, when the HEMT 1020 is used under high voltage, it is necessary to further suppress the gate leakage.

Therefore, a technique of intentionally doping C (carbon) into the cap layer is proposed, for example, in Patent Document 1 below. According to Patent Document 1 below, a technique is disclosed that when forming an electron supply layer by MOCVD (Metal Organic Chemical Vapor Deposition, Organometallic vapor phase epitaxy), C is intentionally doped to increase the concentration of C in the region on the surface side of the electron supply layer. In Patent Document 1 below, the growth temperature when forming the area on the surface side of the electron supply layer made of AlGaN is made lower than the growth temperature when forming a region on the electronic traveling layer side of the electron supply layer. According to the technique of Patent Document 1 below, by doping with C, the resistance of the region on the surface side of the electron supply layer is increased, so that the gate leakage can be suppressed furthermore.

PRIOR ART DOCUMENT

[Patent Document 1] Japanese published unexamined application No. 2018-200934

According to the prior-art, it was necessary to lower the growth temperature of the cap layer in order to incorporate the required amount of C into the cap layer. In particular, it was necessary to set growth temperature of the cap layer to about 300 degrees Celsius lower than the growth temperature of the barrier layer (the electron supply layer in Patent Document 1) which is a lower layer or the growth temperature of the cap layer when C is not intentionally doped.

However, surface roughness of the barrier layer occurred if the growth temperature was greatly lowered when starting the film formation of the cap layer. Also, the quality of the cap layer was degraded. As a result, according to the prior art, when C was intentionally doped into the cap layer, the problem caused by the surface roughness of the barrier layer occurred again.

The present invention is to solve the above problems, and the object of the present invention is to provide a compound semiconductor substrate and a method for manufacturing of a compound semiconductor substrate capable of suppressing surface roughness of the barrier layer while suppressing the gate leakage.

SUMMARY OF THE INVENTION

A compound semiconductor substrate according to the present invention comprises: an electronic traveling layer consisting of a first nitride semiconductor, a barrier layer formed on the electronic traveling layer and consisting of a second nitride semiconductor having a wider band gap than a band gap of the first nitride semiconductor, and a cap layer consisting of a nitride semiconductor formed on the barrier layer and in contact with the barrier layer, wherein the cap layer has a C concentration of $5*10^{17}$ atoms/cm3 or more and $1*10^{20}$ atoms/cm3 or less, and when a square area that is an area containing a center of a top surface of the cap layer and has a side of 5 micrometers is defined, root mean square height Rq in the area is greater than 0 and less than or equal to 1.0 nanometer.

Preferably, in the compound semiconductor substrate according to above, the barrier layer consists of $Al_eGa_{1-e}N$ ($0.17 \le e \le 0.27$), and the cap layer consists of $Al_gGa_{1-g}N$ ($0 \le g \le 0.15$).

Preferably, in the compound semiconductor substrate according to above, the barrier layer consists of $Al_eGa_{1-e}N$ ($0.19 \le e \le 0.22$), and the cap layer consists of $Al_gGa_{1-g}N$ ($0 \le g \le 0.08$).

Preferably, in the compound semiconductor substrate according to above, the cap layer is made of GaN.

Preferably, in the compound semiconductor substrate according to above further comprises a substrate, a buffer layer containing AlN formed on the substrate, and a nitride semiconductor layer formed on the buffer layer, wherein the electronic traveling layer is made of GaN and formed on the nitride semiconductor layer, and the barrier layer consists of a nitride semiconductor containing Al.

Preferably, in the compound semiconductor substrate according to above, the substrate consists of Si, and the compound semiconductor substrate further comprising a SiC layer formed between the substrate and the buffer layer; and the nitride semiconductor layer includes: an Al nitride semiconductor layer made of a material represented by $Al_aGa_{1-a}N$ ($0<a \le 1$) formed on the buffer layer, and a composite layer formed on the Al nitride semiconductor layer, and the composite layer includes: stacked multiple GaN layers, and one or more AlN layer(s) formed between the multiple GaN layers, and the uppermost GaN layer among the multiple GaN layers has a C concentration higher than a C concentration of the electronic traveling layer.

According to another aspect of the invention, a method for manufacturing of a compound semiconductor substrate comprises: a step forming an electronic traveling layer consisting of a first nitride semiconductor, a step forming a barrier layer consisting of a second nitride semiconductor having a wider band gap than a band gap of the first nitride semiconductor on the electronic traveling layer, and a step forming a cap layer with an organometallic vapor phase epitaxy on the barrier layer and in contact with the barrier layer, wherein the cap layer has a C concentration of $5*10^{17}$ atoms/cm3 or more and $1*10^{20}$ atoms/cm3 or less, and consists of a nitride semiconductor, and the step forming the cap layer introduces source gas of the nitride semiconductor forming the cap layer and hydrocarbon gas onto a top surface of the barrier layer.

Preferably, in the method for manufacturing above, the step forming the electronic traveling layer forms the electronic traveling layer on a substrate, a temperature of the substrate is a first temperature at the step forming the barrier layer, a temperature of the substrate is a second temperature at the step forming the cap layer, and when a third temperature is 25 degrees Celsius lower than the first temperature, the second temperature is higher than the third temperature.

Preferably, in the method for manufacturing above, the second temperature is equal to the first temperature.

According to the present invention, a compound semiconductor substrate and a method for manufacturing of a compound semiconductor substrate capable of suppressing surface roughness of the barrier layer while suppressing the gate leakage can be provided.

BRIEF DESCRIPTION OF THE DRAWINGS

FIG. 14 is a table showing measurement results of samples 1 to 3 in the first Example of the present invention.

FIG. 15 is a diagram showing images within region RG of each of samples 1 and 2 captured by AFM.

FIG. 19 is a diagram showing values of concentration errors ΔC calculated in the third example of the present invention.

FIG. 20 is a diagram showing values of film thickness error ΔW calculated in the third example of the present invention.

FIG. 21 is a diagram showing defect density values measured in the third example of the present invention.

DETAILED DESCRIPTION OF EMBODIMENTS

Hereinafter, embodiments of the present invention will be described with reference to the drawings.

First Embodiment

Figure 1:
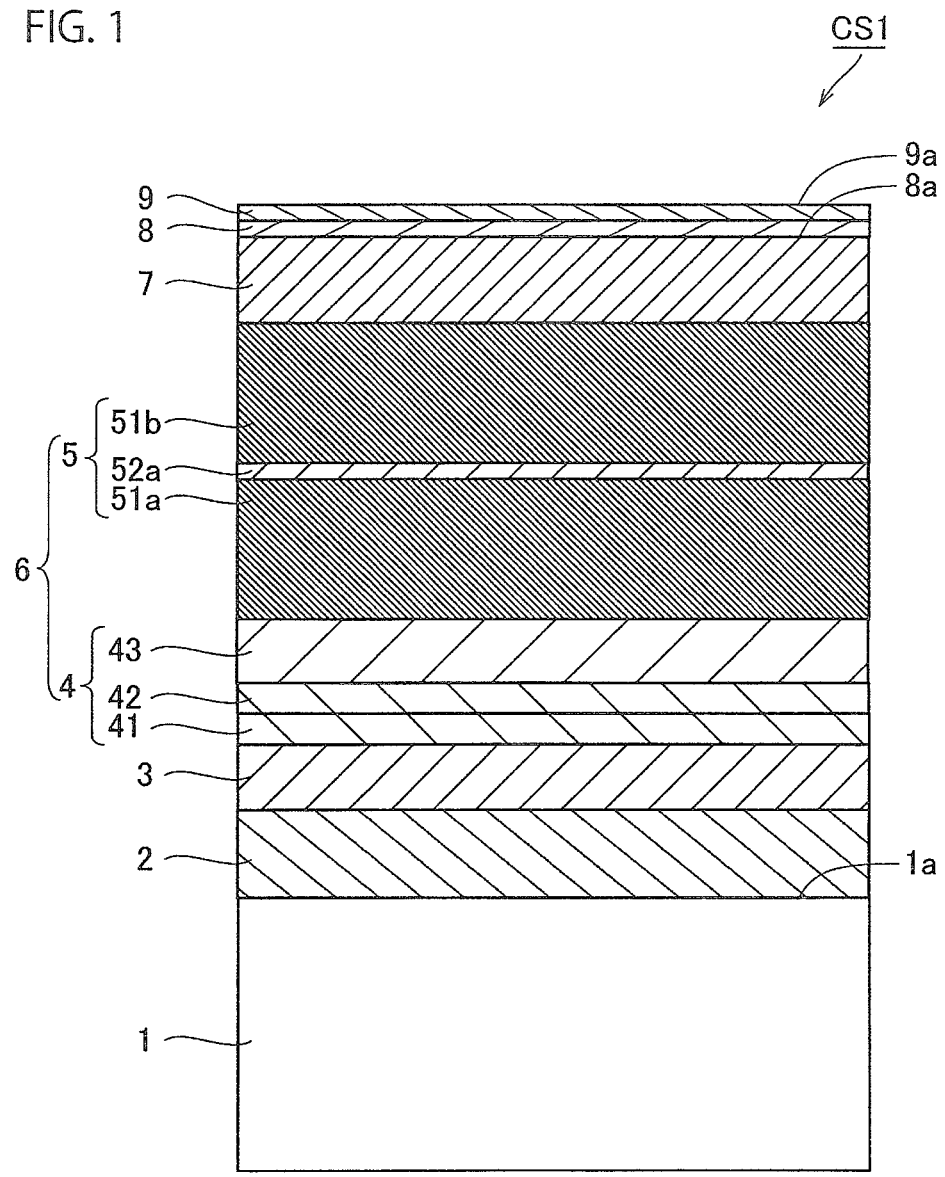
FIG. 1 is a cross-sectional view showing a structure of a compound semiconductor substrate CS1 according to the first embodiment of the invention.

FIG. 1 is a cross-sectional view showing a structure of a compound semiconductor substrate CS1 according to the first embodiment of the invention.

Referring to FIG. 1, compound semiconductor substrate CS1 (an example of a compound semiconductor substrate) in the present embodiment includes a HEMT. Compound semiconductor substrate CS1 comprises substrate 1 (an example of a substrate), SiC layer 2 (an example of a SiC layer), AlN buffer layer 3 (an example of a buffer layer), nitride semiconductor layer 6 (an example of a nitride semiconductor layer), electronic traveling layer 7 (an example of an electrons traveling layer), barrier layer 8 (an example of a barrier layer), and cap layer 9 (an example of a cap layer).

Substrate 1 is made of, for example, p+ type Si. The (111) plane is exposed on the top surface of substrate 1. Substrate 1 may have n-type conductivity or may be semi-insulating. Substrate 1 may be made of a material other than Si, such as SiC or a sapphire. The (100) plane or the (110) plane may be exposed on the surface of the substrate 1. Substrate 1, for example, has a diameter of 6 inches and a thickness of 1000 micrometers.

SiC layer 2 is in contact with substrate 1 and is formed on substrate 1. SiC layer 2 consists of 3C—SiC, 4H—SiC, 6H—SiC or the like. In particular, if the SiC layer 2 is epitaxially grown on substrate 1 consisting of Si, then typically the SiC layer 2 consists of 3C—SiC.

SiC layer 2 may be formed by growing SiC on a foundation layer consisting of SiC obtained by carbonize of the surface of the substrate 1 consisting of Si, using the MBE (Molecular Beam Epitaxy), the CVD (Chemical Vapor Deposition), or the LPE (Liquid Phase Epitaxy) method. SiC layer 2 may be formed only by carbonizing the surface of substrate 1 made of Si. Further, SiC layer 2 may be hetero epitaxially grown to be formed on the surface of substrate 1 made of Si (or with a buffer layer interposed therebetween). SiC layer 2 is doped with, for example, N (nitrogen) and has a conductivity of n-type. SiC layer 2 has a thickness of, for example, 0.1 micrometers or more and 3.5 micrometers or less. SiC layer 2 may have p-type conductivity or may be semi-insulating.

When SiC layer 2 is formed on substrate 1 made of Si, it is easier to form SiC layer 2 with a large area than when bulk substrate 1 made of SiC is used. Further, Si constituting substrate 1 and Ga contained in a layer formed on SiC layer 2 can be separated by SiC layer 2. As a result, meltback etching caused by Si forming substrate 1 and Ga (gallium) contained in a layer formed on SiC layer 2 can be suppressed. When using substrate 1 consisting of SiC, SiC layer 2 may be omitted.

AlN buffer layer 3 is a layer which includes AlN. AlN buffer layer 3 is in contact with SiC layer 2, and formed on SiC layer 2. AlN buffer layer 3 serves as a buffer layer that mitigates the difference in lattice constant values between SiC layer 2 and Al nitride semiconductor layer 4. AlN buffer layer 3 is formed using, for example, the MOCVD method. The growth temperature of AlN buffer layer 3 (the growth temperature corresponds to the temperature of the substrate when forming the layer) is, for example, 1000 degrees Celsius or more and 1300 degrees Celsius or less. At this time, as Al (aluminum) source gas, for example, TMA (Tri Methyl Aluminum), TEA (Tri Ethyl Aluminum) or the like is used. As N source gas, for example, $NH_3$ (ammonia) is used. AlN buffer layer 3 has a thickness of, for example, 100 nanometers or more and 1000 nanometers or less.

Nitride semiconductor layer 6 is in contact with AlN buffer layer 3 and is formed on AlN buffer layer 3. Nitride semiconductor layer 6 is a layer consisting of nitride semiconductors. In this embodiment, nitride semiconductor layer 6 includes Al nitride semiconductor layer 4 (an example of an Al nitride semiconductor layer) and composite layer 5 (an example of a composite layer).

Al nitride semiconductor layer 4 is in contact with AlN buffer layer 3 and is formed on AlN buffer layer 3. Al nitride semiconductor layer 4 consists of nitride semiconductor containing Al, for example, a material represented by $Al_aGa_{1-a}N$ (0<a≤1). Also, Al nitride semiconductor layer 4 may be made of a material represented by $Al_aIn_bGa_{1-a-b}N$ (0<a≤1, 0≤b<1, 0≤a+b≤1). Al nitride semiconductor layer 4 acts as a buffer layer that reduces the lattice constant value difference between AlN buffer layer 3 and C—GaN layer 51a in composite layer 5. Al nitride semiconductor layer 4 has a thickness of, for example, 500 nanometers or more and 2 micrometers or less, preferably 900 nanometers or more and 2 micrometers or less. Al nitride semiconductor layer 4 is formed using, for example, the MOCVD method.

Composite layer 5 is in contact with Al nitride semiconductor layer 4 and is formed on Al nitride semiconductor layer 4. Composite layer 5 contains multiple C—GaN layers stacked in a vertical direction (same direction as the stacking direction of substrate 1, SiC layer 2, AlN buffer layer 3, and Al nitride semiconductor layer 4, the vertical direction in FIG. 1), and AlN layers formed between respective the multiple C—GaN layers. In other words, composite layer 5 has a configuration in which a C—GaN layer and an AlN layer are alternately stacked one or more times, and the top layer and the bottom of composite layer 5 layer is both the C—GaN layer. The C—GaN layer is a GaN layer containing C (a GaN layer intentionally doped with C). C plays a role in enhancing the insulation of the GaN layer.

The number of C—GaN layers forming composite layer 5 should be 2 or more, and the number of AlN layers forming composite layer 5 is also arbitrary. Composite layer 5 of the present embodiment includes 2 layers of C—GaN layers 51a and 51b as C—GaN layers and 1 layer of AlN layer 52a. C—GaN layer 51a is the lowest layer among the layers constituting composite layer 5 and is in contact with Al nitride semiconductor layer 4. C—GaN layer 51b is the uppermost layer among the layers constituting composite layer 5, and is in contact with electronic traveling layer 7. AlN layer 52a is formed between C—GaN layer 51a and C—GaN layer 51b.

In each of multiple C—GaN layers that make up composite layer 5 (C—GaN layers 51a and 51b in this embodiment), the average carbon concentration in the depth direction at the center PT1 (FIG. 4) is $3*10^{18}$ atoms/cm³ or more and $5*10^{20}$ atoms/cm³ or less, preferably $3*10^{18}$ atoms/cm³ or more and $2*10^{19}$ atoms/cm³ or less. The plurality of the GaN layers constituting composite layer 5 may have the same average carbon concentration or may have different average carbon concentrations from each other. The uppermost C—GaN layer 51b among the multiple C—GaN layers has a higher C concentration than that of electronic traveling layer 7.

Also, each of the multiple C—GaN layers that make up composite layer 5 has a thickness of, for example, 550 nanometers or more and 3000 nanometers or less, preferably 800 nanometers or more and 2500 nanometers or less. Multiple C—GaN layers that make up composite layer 5 may have the same thickness or different thicknesses.

The AlN layer (AlN layer 52a in this embodiment) that constitutes composite layer 5 has a thickness of, for example, 3 nanometers or more and 50 nanometers or less, preferably 20 nanometers or less. When there are a plurality of AlN layers forming composite layer 5, the AlN layers forming composite layer 5 may have the same thickness or may have different thicknesses.

C—GaN layers 51a and 51b constituting composite layer 5 are formed using the MOCVD method. At this time, as Ga source gas, for example, TMG (Tri Methyl Gallium), TEG (Tri Ethyl Gallium), or the like is used. As N source gas, for example, $NH_3$ or the like is used. The AlN layer that constitutes composite layer 5 is formed in a similar manner to AlN buffer layer 3.

Typically, when forming a C—GaN layer, the growth temperature of the GaN layer is set lower than the growth temperature of a GaN layer without incorporating C (in particular, the temperature is set to about 300 degrees Celsius lower than the growth temperature of a GaN layer which is not intentionally doped with C). As a result, C contained in Ga source gas is taken into the GaN layer, and the GaN layer becomes a C—GaN layer. On the other hand, when the growth temperature of the GaN layer is lowered, the quality of the C—GaN layer is lowered, and the in-plane uniformity of the C concentration in the C—GaN layer is lowered.

As for a configuration with a Si substrate, a buffer layer containing AlN formed on the Si substrate, a nitride semiconductor layer containing Al formed on the top surface side of the buffer layer, and a GaN layer formed on the nitride semiconductor layer, the inventors have found a method to introduce hydrocarbon as C source gas (C precursor) together with Ga source gas and N source gas into the reaction chamber, when forming the GaN layer (here, each of C—GaN layers 51a and 51b). This method facilitates the incorporation of C into the GaN layer. Hence, the C—GaN layer can be formed while setting the GaN growth temperature to a high temperature (In particular, about 200 degrees Celsius lower temperature than a growth temperature of a GaN layer which is not intentionally doped with C is set). As a result, the quality of the C—GaN layer is improved, and the in-plane uniformity of the C concentration of the C—GaN layer is improved.

Specifically, as C source gas, hydrocarbon such as methane, ethane, propane, butane, pentane, hexane, heptane, octane, ethylene, propylene, butene, pentene, hexene, heptene, octene, acetylene, propyne, butin, pentin, hexin, heptin, octyne, or the like is used. In particular, hydrocarbon containing a double bond or a triple bond is preferred due to its high reactivity. As C source gas, only one type of hydrocarbon may be used, or two or more types of hydrocarbons may be used.

Another layer or other layers such as an undoped GaN layer may intervene between Al nitride semiconductor layer 4 and composite layer 5. In this specification, a "undoped layer" means a layer that is not doped intentionally with impurity when forming the layer, and it covers a layer in which impurity is unintentionally incorporated when forming the layer.

Electronic traveling layer 7 is in contact with nitride semiconductor layer 6 and is formed on nitride semiconductor layer 6. Electronic traveling layer 7 consists of an arbitrary nitride semiconductor (a first nitride semiconductor). Electronic traveling layer 7 is made of, for example, undoped GaN (an example of a first nitride semiconductor) and is semi-insulating. Electronic traveling layer 7 has a thickness of, for example, 100 nanometers or more and 1000 nanometers or less. Electronic traveling layer 7 is made of a material represented, for example, by $Al_cGa_{1-c}N$ (0<c≤1). Electronic traveling layer 7 may consist of a material represented by $Al_cIn_dGa_{1-c-d}N$ (0<c≤1, 0≤d<1, 0≤c+d≤1). Electronic traveling layer 7 is formed using the MOCVD method. If electronic traveling layer 7 is made of GaN, the Ga source gas is, for example, TMG, TEG or the like. As N source gas, for example, $NH_3$ is used.

Barrier layer 8 is in contact with electronic traveling layer 7 and is formed on electronic traveling layer 7. Barrier layer 8 consists of a nitride semiconductor with a wider band gap than the band gap of the material that makes up electronic traveling layer 7. Barrier layer 8 is made of, for example, nitride semiconductor containing Al (an example of a second nitride semiconductor), and is made of a material represented by $Al_eGa_{1-e}N$ (0≤e≤1), for example. Barrier layer 8 may be made of a material represented by $Al_eIn_fGa_{1-e-f}N$ (0≤e≤1, 0≤f<1, 0≤e+f≤1). Barrier layer 8 preferably consists of $Al_eGa_{1-e}N$ (0.17≤e≤0.27), more preferably $Al_eGa_{1-e}N$ (0.19≤e≤0.22). Barrier layer 8 has a thickness of, for example, 10 nanometers or more and 50 nanometers or less. Barrier layer 8 preferably has a thickness of, for example, 25 nanometers or more and 34 nanometers or less. If barrier layer 8 is made of a material represented by $Al_eGa_{1-e}N$ (0≤e≤1), a growth temperature (substrate surface temperature) for forming barrier layer 8 is, for example, 1000 degrees Celsius or more and 1100 degrees Celsius or less. If barrier layer 8 is made of a material represented by $Al_eGa_{1-e}N$ (0≤e≤1), barrier layer 8 may be formed in the same manner as Al nitride semiconductor layer 4.

A spacer layer or the like may be interposed between electronic traveling layer 7 and barrier layer 8.

Cap layer 9 is in contact with barrier layer 8 and is formed on barrier layer 8. Cap layer 9 consists of nitride semiconductor. Cap layer 9 is made of a material represented, for example, by $Al_gGa_{1-g}N$ (0≤g≤1). Cap layer 9 may consist of a material represented by $Al_gIn_hGa_{1-g-h}N$ (0≤g≤1, 0≤h<1, 0≤g+h≤1). Cap layer 9 preferably consists of $Al_gGa_{1-g}N$ (0≤g≤0.15), more preferably $Al_gGa_{1-g}N$ (0≤g≤0.08). Cap layer 9 typically consists of GaN. Cap layer 9 has a thickness of, for example, 1 nanometer or more and 5 nanometers or less.

When barrier layer 8 is made of a material expressed by $Al_eGa_{1-e}N$ (0≤e≤1) and cap layer 9 is made of a material expressed by $Al_gGa_{1-g}N$ (0≤g≤1), the Al composition ratios of barrier layer 8 and cap layer 9 may be the same, but the Al composition ratio of cap layer 9 is preferably lower than that of barrier layer 8.

Cap layer 9 is intentionally doped with C. For this reason, it has a higher concentration of C compared to an undoped cap layer. In particular, cap layer 9 has C concentration of $5*10^{17}$ atoms/cm$^3$ or more and $1*10^{20}$ atoms/cm$^3$ or less. C plays a role in increasing the insulation of cap layer 9.

Barrier layer 8 and cap layer 9 may be made of the same material (for example, AlGaN). When barrier layer 8 and cap layer 9 are made of the same material, barrier layer 8 and cap layer 9 are distinguished from each other by the C concentration of cap layer 9 being higher than that of barrier layer 8.

When a square region RG (FIG. 4) including the center of top surface 9a of cap layer 9 and having sides of 5 micrometers is defined, root mean square height Rq (Hereinafter, it may be written as surface roughness Rq) in region RG is greater than 0 and less than or equal to 1.0 nanometer.

Cap layer 9 is formed using the MOCVD method. At this time, as Al source gas, for example, TMA, TEA, or the like is used (when cap layer 9 is made of GaN (when g=1 in $Al_gGa_{1-g}N$), Al source gas is omitted). As Ga source gas, for example, TMG, TEG, or the like is used. As N source gas, for example, $NH_3$ is used.

Typically, in order to increase C concentration in a layer, it is necessary to set the growth temperature of the layer lower than a growth temperature of an undoped layer. In particular, when the cap layer is made of a material represented by $Al_gGa_{1-g}N$ (0≤g≤1), in order to increase the C concentration of the cap layer, it is necessary to set the temperature about 300 degrees Celsius lower than that of a growth temperature when it is not doped with C, typically.

As a result, C contained in Ga source gas or the like is incorporated into cap layer 9, and the C concentration of cap layer 9 increases. On the other hand, if a growth temperature of the cap layer is lowered, the surface roughness of the barrier layer occurs during the substrate temperature drops at the start of the film forming of the cap layer. It also reduces the quality of cap layer 9.

Therefore, the inventors of the present application discovered a method to introduce hydrocarbon as C source gas (C precursor) along with source gas of the nitride semiconductor composing cap layer 9 such as Ga source gas, N source gas, or the like to top surface 8a of barrier layer 8 in the reaction chamber, when forming cap layer 9. According to this method, incorporation of C into cap layer 9 is promoted without lowering the growth temperature of cap layer 9. As a result, since it is possible to increase the C concentration of cap layer 9 while setting the growth temperature of cap layer 9 high, the surface roughness of barrier layer 8 and quality deterioration of cap layer 9 can be suppressed.

If the growth temperature when forming barrier layer 8 is temperature T1 (e.g. 1030 degrees Celsius) and a temperature which is 25 degrees Celsius lower than the temperature T1 is temperature T3 (e.g. 1005 degrees Celsius), the temperature T2 which is the growth temperature when forming cap layer 9, is preferably higher than temperature T3. More preferably, temperature T2 is equal to temperature T1. When cap layer 9 is made of a material represented by $Al_gGa_{1-g}N$ (0≤g≤1), temperature T3 is, for example, 1000 degrees Celsius or more and 1100 degrees Celsius or less.

Specifically, as C source gas, hydrocarbon such as methane, ethane, propane, butane, pentane, hexane, heptane, octane, ethylene, propylene, butene, pentene, hexene, heptene, octene, acetylene, propyne, butin, pentin, hexin, heptin, or octyne is used. In particular, hydrocarbon containing a double bond or a triple bond is preferred due to its high reactivity. As C source gas, only one type of hydrocarbon may be used, or two or more types of hydrocarbon may be used.

The sum total of thicknesses of composite layer 5, electronic traveling layer 7, barrier layer 8 and cap layer 9 is preferably 5 micrometers or more and 7 micrometers or less.

Figure 2:
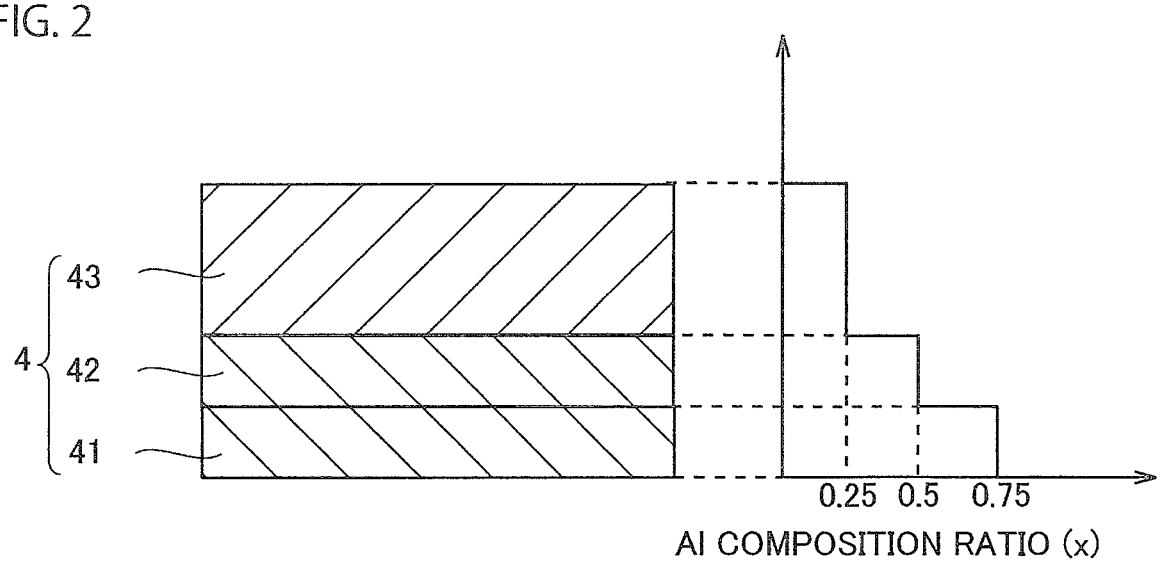
FIG. 2 is a diagram showing distribution of the Al composition ratio inside Al nitride semiconductor layer 4 according to the first embodiment of the present invention.

FIG. 2 is a diagram showing distribution of the Al composition ratio inside Al nitride semiconductor layer 4 according to the first embodiment of the present invention.

Referring to FIG. 2, the Al composition ratio inside Al nitride semiconductor layer 4 decreases from the bottom to the top. Al nitride semiconductor layer 4 includes $Al_{0.75}Ga_{0.25}N$ layer 41 (the AlGaN layer with the composition ratio of Al is 0.75), $Al_{0.5}Ga_{0.5}N$ layer 42 (the AlGaN layer with the composition ratio of Al is 0.5), and $Al_{0.25}Ga_{0.75}N$ layer 43 (the AlGaN layer with the composition ratio of Al is 0.25). $Al_{0.75}Ga_{0.25}N$ layer 41 is formed on AlN buffer layer 3 and in contact with AlN buffer layer 3. $Al_{0.5}Ga_{0.5}N$ layer 42 is formed on $Al_{0.75}Ga_{0.25}N$ layer 41 and in contact with $Al_{0.75}Ga_{0.25}N$ layer 41. $Al_{0.25}Ga_{0.75}N$ layer 43 is formed on $Al_{0.5}Ga_{0.5}N$ layer 42 and in contact with $Al_{0.5}Ga_{0.5}N$ layer 42. The above Al composition ratio is an example, and if the Al composition ratio decreases from the lower part to the upper part, another composition can be adopted.

According to this embodiment, by forming AlN layer 52a between C—GaN layer 51a and C—GaN layer 51b in composite layer 5, the occurrence of warpage in substrate 1 can be suppressed, and the occurrence of cracks into C—GaN layer 51b and electronic traveling layer 7 can be suppressed. This will be described below.

AlN forming the AlN layer 52a is epitaxially grown on the C—GaN layer 51a in the unconformity state (a state in which sliding has occurred) with respect to the crystal of the GaN forming the C—GaN layer 51a. On the other hand, GaN forming C—GaN layer 51b and electronic traveling layer 7 is affected by crystals of AlN forming AlN layer 52a which is the foundation. That is, GaN forming C—GaN layer 51b and electronic traveling layer 7 is epitaxially grown on AlN layer 52a so as to take over the crystal structure of AlN forming AlN layer 52a. Since the GaN lattice constant value is larger than the AlN lattice constant value, the lattice constant value of the GaN constituting C—GaN layer 51b in the horizontal direction of FIG. 1 is smaller than the lattice constant value of general GaN (without compressive strain). In other words, C—GaN layer 51b and electronic traveling layer 7 contain compressive strain within them.

During cooling after the formation of C—GaN layer 51b and electronic traveling layer 7, due to the thermal expansion coefficient difference between GaN and Si, C—GaN layer 51b and electronic traveling layer 7 receive stress from AlN layer 52a. This stress causes the generation of warpage in substrate 1, and causes the generation of cracks into C—GaN layer 51b and electronic traveling layer 7. However, this stress is mitigated by compressive strain introduced inside C—GaN layer 51b and electronic traveling layer 7 during the formation of C—GaN layer 51b and electronic traveling layer 7. As a result, the occurrence of warpage in substrate 1 can be suppressed, and the occurrence of cracks into C—GaN layer 51b and electronic traveling layer 7 can be suppressed.

Compound semiconductor substrate CS1 includes C—GaN layers 51a and 51b, AlN layer 52a, and Al nitride semiconductor layer 4, which has a higher insulation breakdown voltage than insulation breakdown voltage of GaN. As a result, the vertical withstand voltage of the compound semiconductor substrate can be improved.

According to this embodiment, since compound semiconductor substrate CS1 contains Al nitride semiconductor layer 4 between AlN buffer layer 3 and C—GaN layer 51a in composite layer 5, the difference between the lattice constant value of Si and the lattice constant value of GaN can be reduced. This is because the lattice constant value of Al nitride semiconductor layer 4 has a value between the lattice constant value of Si and the lattice constant value of GaN. As a result, the crystal quality of C—GaN layers 51a and 51b can be improved. The occurrence of warpage in substrate 1 can be suppressed, and the occurrence of cracks into C—GaN layer 51a and 51b can be suppressed.

According to this embodiment, since the occurrence of warpage in substrate 1 and the occurrence of cracks into C—GaN layer 51b and electronic traveling layer 7 are suppressed as described above, the film of electronic traveling layer 7 can be thickened.

Further, compound semiconductor substrate CS1 contains SiC layer 2 as the foundation layer of C—GaN layers 51a and 51b and electronic traveling layer 7. The lattice constant value of SiC is closer to the lattice constant value of GaN than the lattice constant value of Si. When electronic traveling layer 7 consists of GaN, by forming C—GaN layers 51a and 51b and electronic traveling layer 7 on SiC layer 2, the crystal quality of C—GaN layers 51a and 51b and electronic traveling layer 7 can be improved.

According to this embodiment, by separating the functions of Al nitride semiconductor layer 4, composite layer 5, and SiC layer 2, effect of suppressing the occurrence of warpage in substrate 1, effect of suppressing the occurrence of cracks into C—GaN layer 51b and electronic traveling layer 7, effect of improving withstand voltage of compound semiconductor substrate CS1, and effect of improving crystal quality of C—GaN layers 51a and 51b and electronic traveling layer 7 can be increased. In particular, according to this embodiment, by using SiC layer 2 as a foundation layer, the contribution of improving the crystal quality of electronic traveling layer 7 is significant.

According to this embodiment, since there is SiC layer 2 and crystal quality of C—GaN layers 51a and 51b and electronic traveling layer 7 is improved, the thickness of the AlN layer in composite layer 5 can be reduced, and the occurrence of warpage and cracks can be suppressed more efficiently. Since there is SiC layer 2 and crystal quality of C—GaN layer 51a is improved, C—GaN layers 51a and 51b and electronic traveling layer 7 can be thickened, and withstand voltage can be further improved. The performance of the HEMT can also be improved.

By introducing hydrocarbon as C source gas when forming each of C—GaN layers 51a and 51b, C—GaN layers 51a and 51b can be formed while the GaN growth temperature is set to a high temperature. The quality of C—GaN layers 51a and 51b improves, since GaN growth temperature is high.

Figure 3:
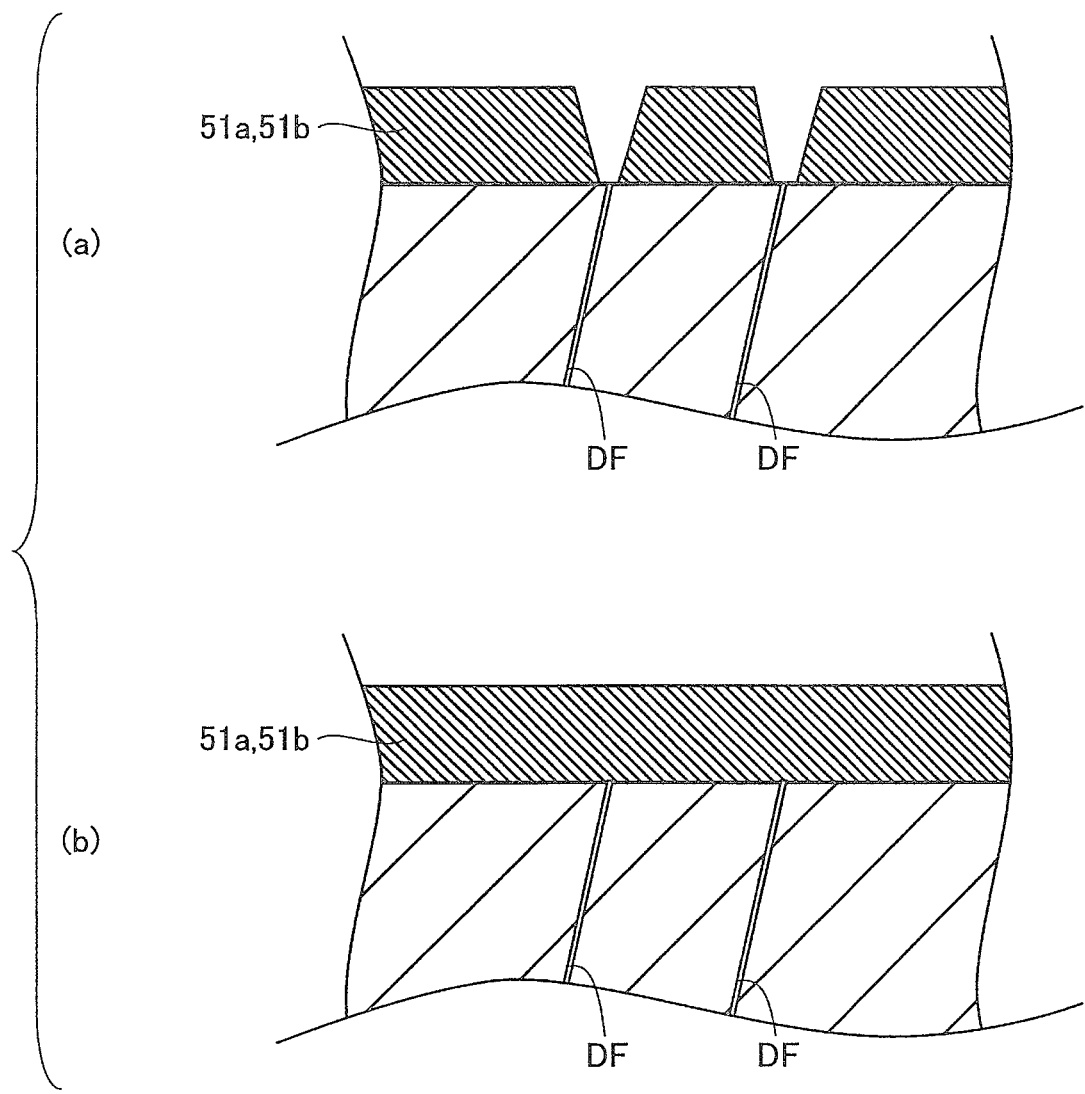
FIG. 3 is a diagram schematically showing two-dimensional growth of GaN forming the GaN layer.

FIG. 3 is a diagram schematically showing two-dimensional growth of GaN forming the GaN layer. FIG. 3 (a) shows growth when the GaN growth temperature is at a low temperature, and FIG. 3 (b) shows growth when the GaN growth temperature is at a high temperature.

Referring to FIG. 3 (a), since the two-dimensional growth (the horizontal direction in FIG. 3) of GaN layer is slow when the growth temperature of GaN is at a low temperature, defects DF such as pits that exist under each of C—GaN layers 51a or 51b are not covered by C—GaN layer 51a and 51b, and defects DF also spreads easily inside each of C—GaN layers 51a and 51b.

With reference to FIG. 3 (b), the GaN growth temperature is high in this embodiment, the two-dimensional growth of GaN is promoted, and the defects DF such as pits that exist under each of the C—GaN layer 51a or 51b are covered with the C—GaN layer 51a or 51b. As a result, the defect density of each of C—GaN layers 51a and 51b can be reduced, and it is possible to avoid a situation in which the defects DF penetrate the compound semiconductor substrate in the vertical direction and the withstand voltage of the compound semiconductor substrate is significantly reduced.

Figure 4:
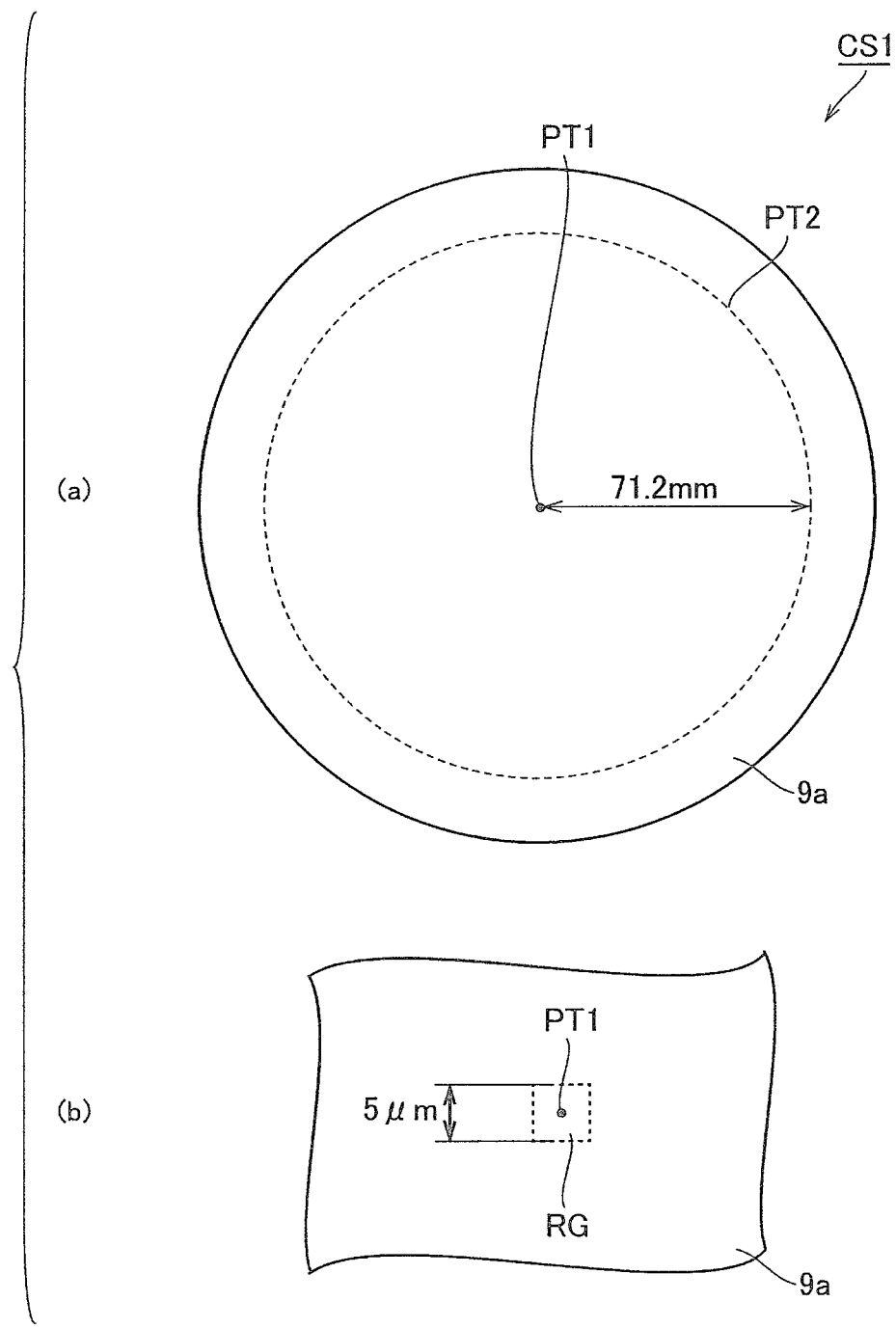
FIG. 4 is a plan view showing the configuration of compound semiconductor substrate CS1 according to the first embodiment of the present invention.

FIG. 4 is a plan view showing the configuration of compound semiconductor substrate CS1 according to the first embodiment of the present invention. FIG. 4 (a) is a diagram showing the configuration of the entire compound semiconductor substrate CS1. FIG. 4 (b) is an enlarged view of the vicinity of the center PT1 of compound semiconductor substrate CS1.

Referring to FIG. 4 (a), the planar shape of the compound semiconductor substrate CS1 is arbitrary. If the compound semiconductor substrate CS1 has a circular planar shape, the diameter of the compound semiconductor substrate CS1 is 6 inches or more. When viewed two-dimensionally, the center of compound semiconductor substrate CS1 is the center PT1, and the position 71.2 millimeters away from the center PT1 (corresponds to 5 millimeters from the outer edge of the 6 inches diameter substrate) is the edge PT2.

As a result of improving the quality of C—GaN layers 51a and 51b, the in-plane uniformity of film thickness of each of C—GaN layers 51a and 51b is improved, and the in-plane uniformity of C concentration of each of C—GaN layers 51a and 51b is improved. The longitudinal intrinsic breakdown voltage value of compound semiconductor substrate CS1 is enhanced and the defect density of each of C—GaN layers 51a and 51b is reduced. As a result, the in-plane uniformity of the vertical current-voltage characteristics can be improved.

In particular, when the carbon concentration at the center position in the depth direction (the vertical direction in FIG. 1) at the center PT1 of the GaN layer is defined as concentration C1, and the carbon concentration at the center position in the depth direction at edge PT2 of the GaN layer is defined as concentration C2, concentration error ΔC, which is expressed as ΔC (%)=|C1−C2|*100/C1 is 0% or more and 50% or less, preferably 0% or more and 33% or less.

When the film thickness at the center PT1 of the GaN layer is defined as film thickness W1, and the film thickness at the edge PT2 of the GaN layer is defined as film thickness W2, film thickness error ΔW which is expressed by ΔW (%)=|W1−W2|*100/W1 is greater than 0 and less than or equal to 8%, preferably greater than 0 and less than or equal to 4%.

Vertical intrinsic breakdown voltage value of compound semiconductor substrate CS1 is 1200V or more and 1600V or less. The defect density at center PT1 of C—GaN layers 51a and 51b causing dielectric breakdown at a voltage value equal to or less than 80% of this intrinsic breakdown voltage value is greater than 0 and equal to or less than 100 defects/cm$^2$, preferably greater than 0 and equal to or less than 2 defects/cm$^2$. The defect density at edge PT2 of C—GaN layers 51a and 51b causing dielectric breakdown at a voltage value equal to or less than 80% of this intrinsic breakdown voltage value is greater than 0 and equal to or less than 7 defects/cm$^2$, preferably greater than 0 and equal to or less than 2 defects/cm$^2$.

Further, when forming cap layer 9, by introducing source gas of the nitride semiconductor which constitute cap layer 9 and hydrocarbon gas to top surface 8a of barrier layer 8, the growth temperature of cap layer 9 is set to a high temperature, and the C concentration of cap layer 9 can be increased. As a result, the resistance of cap layer 9 can be increased, and the gate leakage can be suppressed. The surface roughness of barrier layer 8 and quality deterioration of cap layer 9 can be suppressed.

With reference to FIG. 4 (b), as a result of suppressing the surface roughness of barrier layer 8, the surface roughness Rq within the region RG of the cap layer 9 is greater than 0 and equal to or less than 1.0 nanometer. The region RG is a region containing the center PT1 on the top surface 9a of the cap layer 9 and corresponds to a square region having sides of 5 micrometers.

Second Embodiment

Figure 5:
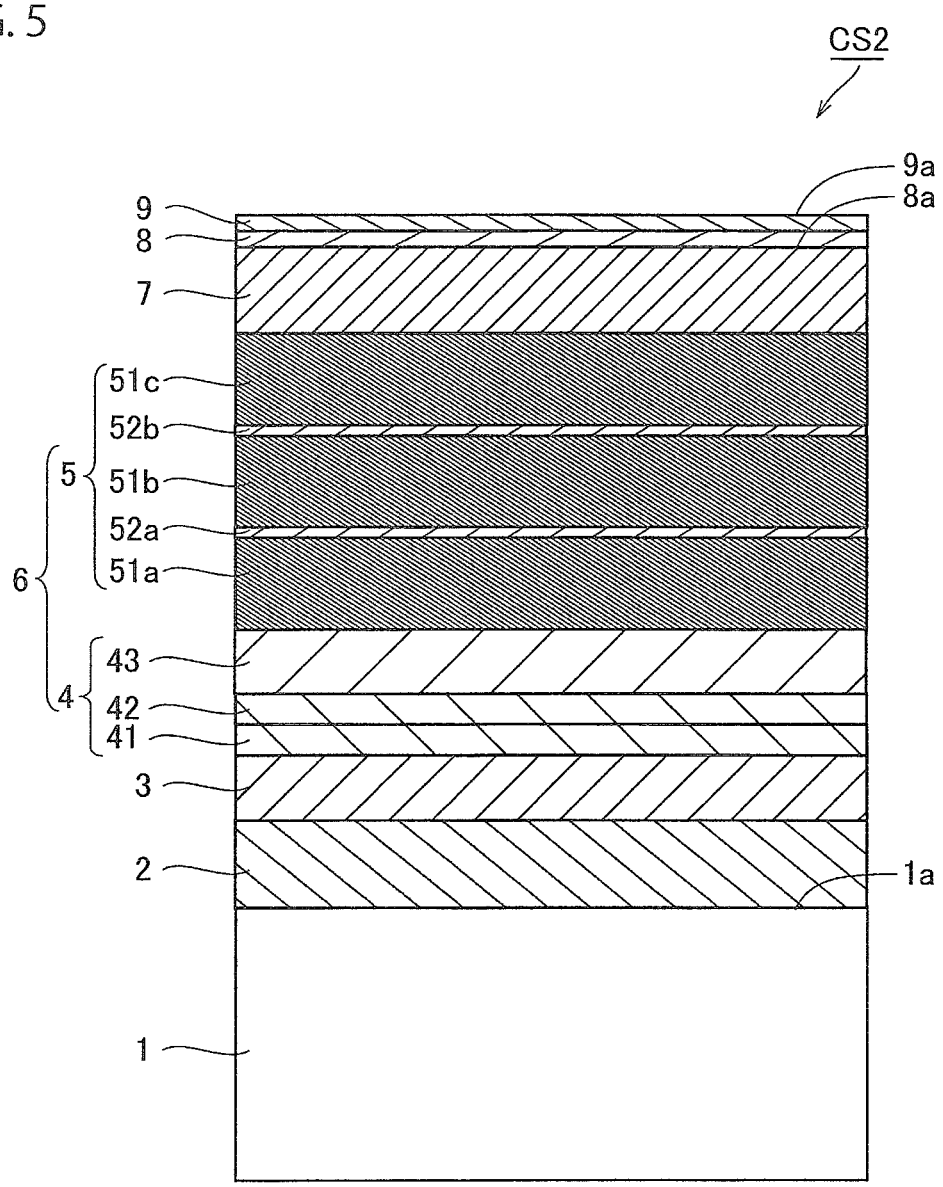
FIG. 5 is a cross-sectional view showing a structure of compound semiconductor substrate CS2 in the second embodiment of the present invention.

FIG. 5 is a cross-sectional view showing a structure of compound semiconductor substrate CS2 in the second embodiment of the present invention.

Referring to FIG. 5, compound semiconductor substrate CS2 according to the present embodiment differs in the internal configuration of composite layer 5 from compound semiconductor substrate CS1 according to the first embodiment. In particular, the composite layer 5 according to the present embodiment includes three layers of C—GaN layers 51a, 51b, and 51c as C—GaN layers, and two layers of AlN layers 52a and 52b. C—GaN layer 51a is the lowest layer among the layers constituting composite layer 5 and is in contact with Al nitride semiconductor layer 4. The AlN layer 52a is formed on the C—GaN layer 51a and in contact with the C—GaN layer 51a. C—GaN layer 51b is formed on the AlN layer 52a and in contact with the AlN layer 52a. AlN layer 52b is formed on C—GaN layer 51b and in contact with C—GaN layer 51b. C—GaN layer 51c is formed on the AlN layer 52b and in contact with the AlN layer 52b. C—GaN layer 51c is the uppermost layer among the layers that make up the composite layer 5 and is in contact with the electronic traveling layer 7.

Since the structures of the compound semiconductor substrate CS2 other than the above is the same as the structures of the compound semiconductor substrate CS1 in the first embodiment, and the description will not be repeated.

According to this embodiment, effects similar to those of the first embodiment can be obtained. In addition, since there are two layers of AlN layers 52a and 52b in the composite layer 5, the effect of applying compressive strain to the upper C—GaN layers 51b and 51c and the electronic traveling layer 7 is increased. As a result, the occurrence of warpage in the substrate 1 can be suppressed, and the occurrence of cracks into the C—GaN layers 51a, 51b and 51c and the electronic traveling layer 7 can be suppressed.

Since two AlN layers 52a and 52b are present in the composite layer 5, the withstand voltage in the vertical direction of the compound semiconductor substrate can be improved.

Modification of the First and Second Embodiments

This modification describes modificated configurations of the Al nitride semiconductor layer 4 of each of the compound semiconductor substrates CS1 and CS2.

Figure 6:
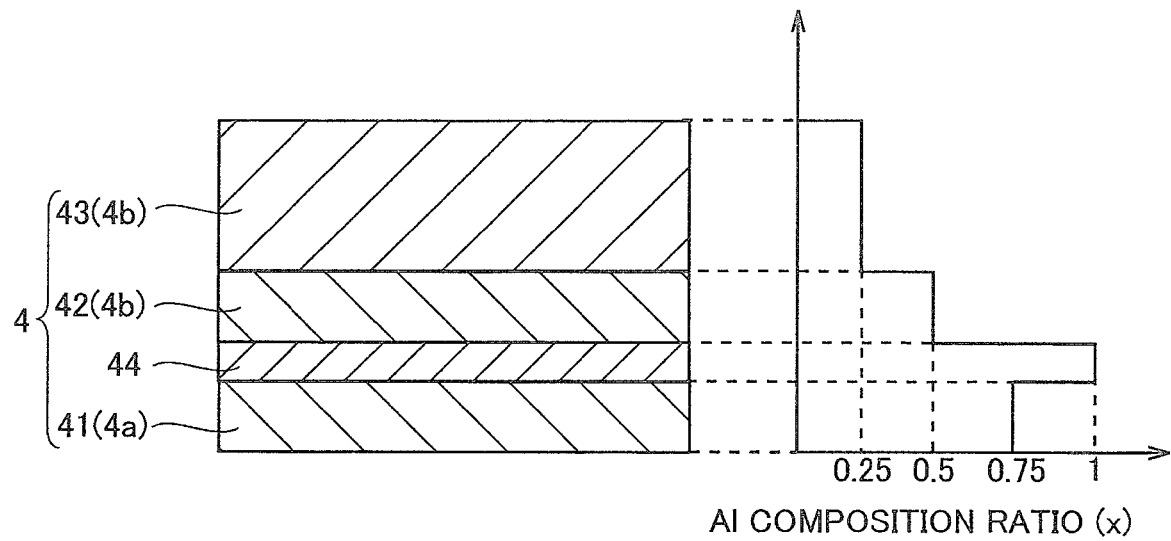
FIG. 6 is a diagram showing an Al composition ratio distribution inside the Al nitride semiconductor layer 4 in the first modification of the first and second embodiments according to the present invention.

FIG. 6 is a diagram showing an Al composition ratio distribution inside the Al nitride semiconductor layer 4 in the first modification of the first and second embodiments according to the present invention.

Referring to FIG. 6, the Al nitride semiconductor layer 4 in this modification includes an AlGaN layer 4a, an AlN intermediate layer 44, and an AlGaN layer 4b.

The AlGaN layer 4a is formed on the AlN buffer layer 3 and in contact with the AlN buffer layer 3. The AlGaN layer 4a is composed of $Al_{0.75}Ga_{0.25}N$ layer 41 (the AlGaN layer with the composition ratio of Al is 0.75). The composition ratio of Al inside the AlGaN layer 4a is constant.

The AlN intermediate layer 44 is formed on the AlGaN layer 4a. The bottom surface of the AlN intermediate layer 44 is in contact with the top surface of the AlGaN layer 4a, and the top surface of the AlN intermediate layer 44 is in contact with the bottom surface of the AlGaN layer 4b.

The AlGaN layer 4b is formed on the AlN intermediate layer 44. The Al composition ratio inside the AlGaN layer 4b decreases from the bottom to the top. AlGaN layer 4b consists of $Al_{0.5}Ga_{0.5}N$ layer 42 (the AlGaN layer with the composition ratio of Al is 0.5) and $Al_{0.25}Ga_{0.75}N$ layer 43 (the AlGaN layer with the composition ratio of Al is 0.25) formed on $Al_{0.5}Ga_{0.5}N$ layer 42 and in contact with $Al_{0.5}Ga_{0.5}N$ layer 42.

Figure 7:
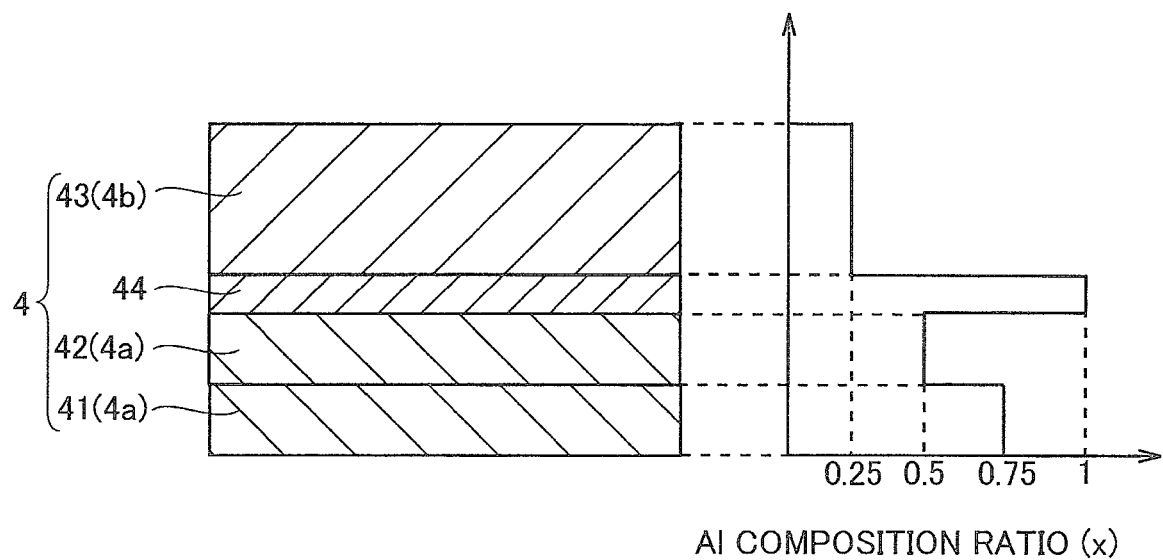
FIG. 7 is a diagram showing distributions of Al composition ratios inside Al nitride semiconductor layer 4 in the second modification of the first and second embodiments of the present invention.

FIG. 7 is a diagram showing distributions of Al composition ratios inside Al nitride semiconductor layer 4 in the second modification of the first and second embodiments of the present invention.

Referring to FIG. 7, Al nitride semiconductor layer 4 in this modification includes AlGaN layer 4a, AlN intermediate layer 44, and AlGaN layer 4b.

The AlGaN layer 4a is formed on the AlN buffer layer 3 and in contact with the AlN buffer layer 3. The composition ratio of Al inside Al GaN layer 4a decreases from the bottom to the top. AlGaN layer 4a is composed of $Al_{0.75}Ga_{0.25}N$ layer 41 (the AlGaN layer with the composition ratio of Al is 0.75) and $Al_{0.5}Ga_{0.5}N$ layer 42 (the AlGaN layer with the composition ratio of Al is 0.5) formed on $Al_{0.75}Ga_{0.25}N$ layer 41 and in contact with $Al_{0.75}Ga_{0.25}N$ layer 41.

The AlN intermediate layer 44 is formed on the AlGaN layer 4a. The bottom surface of the AlN intermediate layer 44 is in contact with the top surface of the AlGaN layer 4a, and the top surface of the AlN intermediate layer 44 is in contact with the bottom surface of the AlGaN layer 4b.

The AlGaN layer 4b is formed on the AlN intermediate layer 44. AlGaN layer 4b consists of $Al_{0.25}Ga_{0.75}N$ layer 43 (the AlGaN layer with the composition ratio of Al is 0.25). The composition ratio of Al inside AlGaN layer 4b is constant.

Figure 8:
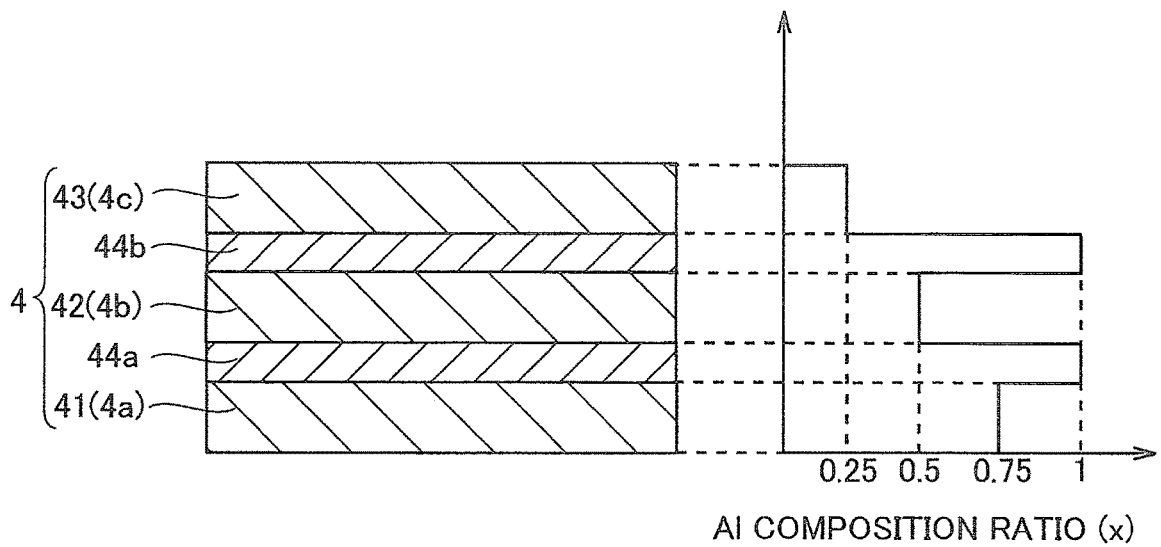
FIG. 8 is a diagram showing the distribution of the Al composition ratio inside the Al nitride semiconductor layer 4 in the third modification of the first and second embodiments of the present invention.

FIG. 8 is a diagram showing the distribution of the Al composition ratio inside the Al nitride semiconductor layer 4 in the third modification of the first and second embodiments of the present invention.

Referring to FIG. 8, Al nitride semiconductor layer 4 in this modification includes AlGaN layer 4a, AlN intermediate layer 44a, AlGaN layer 4b, AlN intermediate layer 44b, and AlGaN layer 4c. According to Al nitride semiconductor layer 4 in this modification, a plurality of AlGaN layers 4a, 4b, and 4c are stacked with AlN intermediate layers 44a and 44b interposed therebetween.

The AlGaN layer 4a is formed on the AlN buffer layer 3 and in contact with the AlN buffer layer 3. The AlGaN layer 4a is composed of $Al_{0.75}Ga_{0.25}N$ layer 41 (the AlGaN layer with the composition ratio of Al is 0.75). The composition ratio of Al inside the AlGaN layer 4a is constant.

AlN intermediate layer 44a is formed on AlGaN layer 4a. The bottom surface of AlN intermediate layer 44a is in contact with the top surface of AlGaN layer 4a, and the top surface of AlN intermediate layer 44a is in contact with the bottom surface of AlGaN layer 4b.

AlGaN layer 4b is formed on the AlN intermediate layer 44a. AlGaN layer 4b consists of $Al_{0.5}Ga_{0.5}N$ layer 42 (the AlGaN layer with the composition ratio of Al is 0.5). The composition ratio of Al inside AlGaN layer 4b is constant.

AlN intermediate layer 44b is formed on AlGaN layer 4b. The bottom surface of AlN intermediate layer 44b is in contact with the top surface of AlGaN layer 4b, and the top surface of AlN intermediate layer 44b is in contact with the bottom surface of AlGaN layer 4c.

AlGaN layer 4c is formed on AlN intermediate layer 44b. AlGaN layer 4c consists of $Al_{0.25}Ga_{0.75}N$ layer 43 (the AlGaN layer with the composition ratio of Al is 0.25). The composition ratio of Al inside AlGaN layer 4c is constant.

In the third modification, the thickness of AlGaN layer 4b is preferably greater than the thickness of AlGaN layer 4a, and the thickness of AlGaN layer 4c is preferably greater than the thickness of AlGaN layer 4b. Each of AlGaN layers 4a, 4b and 4c preferably has a thickness of 0.1 micrometer or more and 0.5 micrometer or less. AlN intermediate layers 44a and 44b preferably have the same thickness. Each of the AlN intermediate layers 44a and 44b preferably has a thickness of 5 nanometers or more and 15 nanometers or less.

Since the configurations other than those described above in each of compound semiconductor substrates according to the first, second, and third modification are the same as those in the above-described embodiment, the same members are given the same reference numerals, and the description will not be repeated.

The AlN intermediate layer functions to generate compressive strain in the AlGaN layer. By providing an AlN intermediate layer like the first, second, and third modifications, warpage and cracks can be further suppressed.

Third Embodiment

Figure 9:
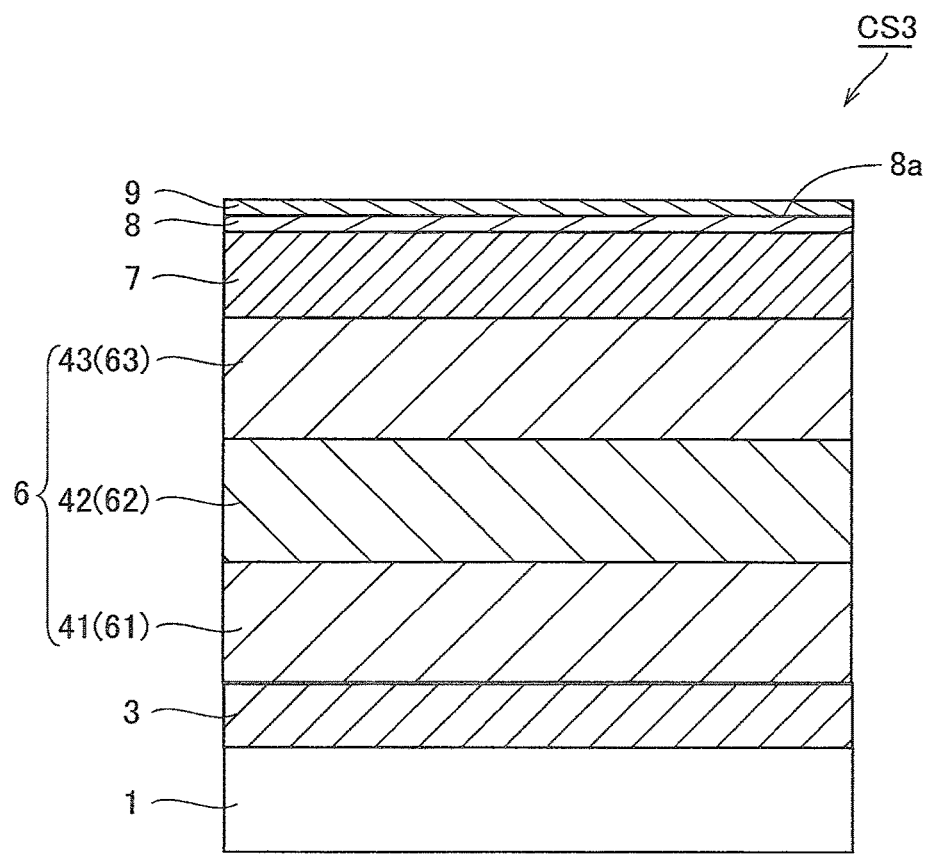
FIG. 9 is a cross-sectional view showing a configuration of compound semiconductor substrate CS3 in the third embodiment of the present invention.

FIG. 9 is a cross-sectional view showing a configuration of compound semiconductor substrate CS3 in the third embodiment of the present invention.

Referring to FIG. 9, compound semiconductor substrate CS3 in the present embodiment differs from compound semiconductor substrate CS1 in the first embodiment mainly in the internal configuration of nitride semiconductor layer 6. In particular, nitride semiconductor layer 6 in this embodiment includes AlGaN layers 61, 62, and 63. AlGaN layer 61 is formed on AlN buffer layer 3 and in contact with AlN buffer layer 3. AlGaN layer 62 is formed on AlGaN layer 61 and in contact with AlGaN layer 61. AlGaN layer 63 is formed on AlGaN layer 62 and in contact with AlGaN layer 62.

The Al composition ratios of AlGaN layers 61, 62 and 63 are different from each other. The Al composition ratio inside each of AlGaN layers 61, 62 and 63 is constant. As an example, AlGaN layer 61 consists of $Al_{0.75}Ga_{0.25}N$ layer 41 (the AlGaN layer with the composition ratio of Al is 0.75). AlGaN layer 62 consists of $Al_{0.5}Ga_{0.5}N$ layer 42 (the AlGaN layer with the composition ratio of Al is 0.5). AlGaN layer 63 consists of $Al_{0.25}Ga_{0.75}N$ layer 43 (the AlGaN layer with the composition ratio of Al is 0.25). The Al composition ratio of AlGaN layer 62 is lower than the Al composition ratio of AlGaN layer 61. The Al composition ratio of AlGaN layer 63 is lower than the Al composition ratio of AlGaN layer 62.

The substrate 1 consists of Si, SiC, or the like. On substrate 1, AlN buffer layer 3 is formed in contact with substrate 1. A SiC layer is not formed. As in the first embodiment, if substrate 1 is made of Si, SiC layer 2 may be formed between substrate 1 and AlN buffer layer 3.

Since the configurations of compound semiconductor substrate CS3 other than the above is the same as the configurations of compound semiconductor substrate CS1 in the first embodiment, the same members are denoted by the same reference numerals, and the description will not be repeated.

According to the present embodiment, as in the first embodiment, source gas of the nitride semiconductor forming cap layer 9 and hydrocarbon gas are introduced into the top surface 8a of barrier layer 8, when forming cap layer 9. As a result, the C concentration of cap layer 9 can be increased while setting the growth temperature of cap layer 9 to a high temperature. As a result, by increasing the C concentration of cap layer 9, the resistance of cap layer 9 can be increased, and gate leakage can be suppressed. Since there is no need to lower the growth temperature of the cap layer, the surface roughness of barrier layer 8 and quality deterioration of cap layer 9 can be suppressed.

Fourth Embodiment

Figure 10:
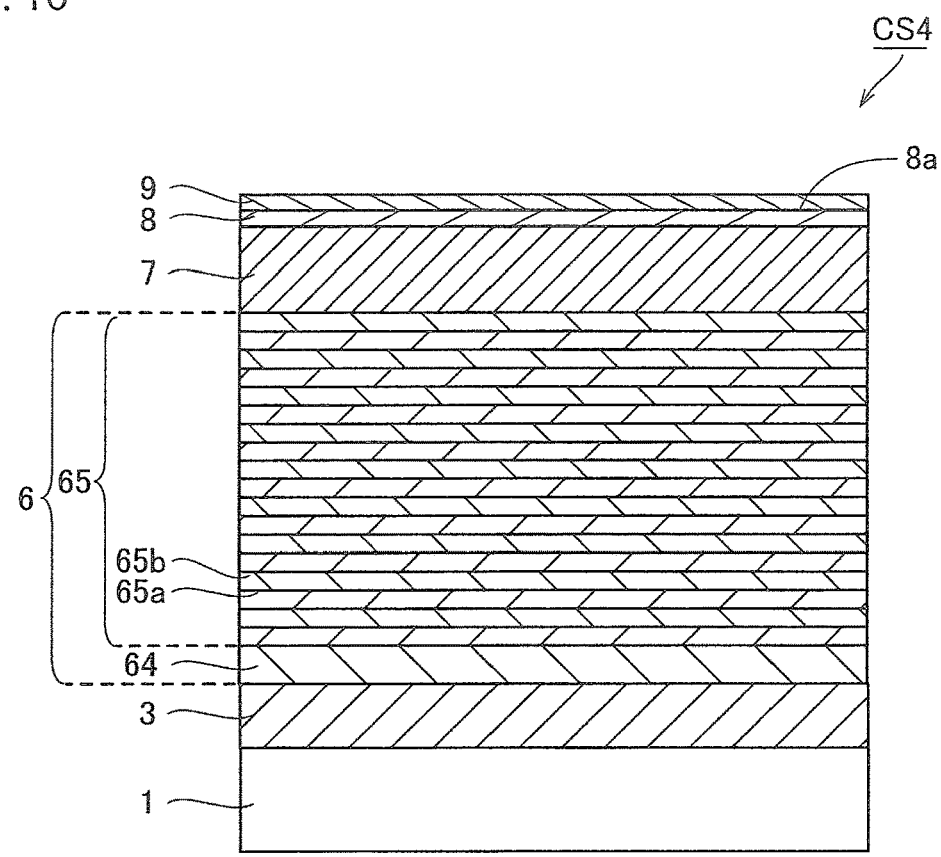
FIG. 10 is a cross-sectional view showing a configuration of compound semiconductor substrate CS4 according to the fourth embodiment of the present invention.

FIG. 10 is a cross-sectional view showing a configuration of compound semiconductor substrate CS4 according to the fourth embodiment of the present invention.

Referring to FIG. 10, the compound semiconductor substrate CS4 according to this embodiment differs from compound semiconductor substrate CS1 in the first embodiment mainly in the internal configuration of nitride semiconductor layer 6. In particular, nitride semiconductor layer 6 in the present embodiment includes AlGaN layer 64 and hyperlattice layer 65.

AlGaN layer 64 is formed on AlN buffer layer 3 and in contact with AlN buffer layer 3. AlGaN layer 64 has an arbitrary Al composition ratio.

The hyperlattice layer 65 is formed on AlGaN layer 64 and in contact with AlGaN layer 64. The hyperlattice layer 65 includes multiple GaN layers 65a and multiple AlN layers 65b. GaN layer 65a and AlN layer 65b are formed alternately. The total number of multiple GaN layers 65a and multiple AlN layers 65b is 100 layers or more. Each of the plurality of GaN layers 65a and the plurality of AlN layers 65b is a superlattice and has a thickness of 1 nanometer or more and 10 nanometers or less.

The substrate 1 consists of Si, SiC, or the like. On substrate 1, AlN buffer layer 3 is formed in contact with substrate 1. A SiC layer is not formed. As in the first embodiment, if substrate 1 is made of Si, SiC layer 2 may be formed between substrate 1 and AlN buffer layer 3.

The configurations of the compound semiconductor substrate CS4 other than the above is the same as the configurations of the compound semiconductor substrate CS1 in the first embodiment, the same members are denoted by the same reference numerals, the description will not be repeated.

According to the present embodiment, as in the first embodiment, source gas of the nitride semiconductor forming cap layer 9 and hydrocarbon gas are introduced into the top surface 8a of barrier layer 8, when forming cap layer 9. As a result, the C concentration of cap layer 9 can be increased while setting the growth temperature of cap layer 9 to a high temperature. As a result, by increasing the C concentration of cap layer 9, the resistance of cap layer 9 can be increased, and gate leakage can be suppressed. Since there is no need to lower the growth temperature of the cap layer, the surface roughness of barrier layer 8 and quality deterioration of cap layer 9 can be suppressed.

Fifth Embodiment

Figure 11:
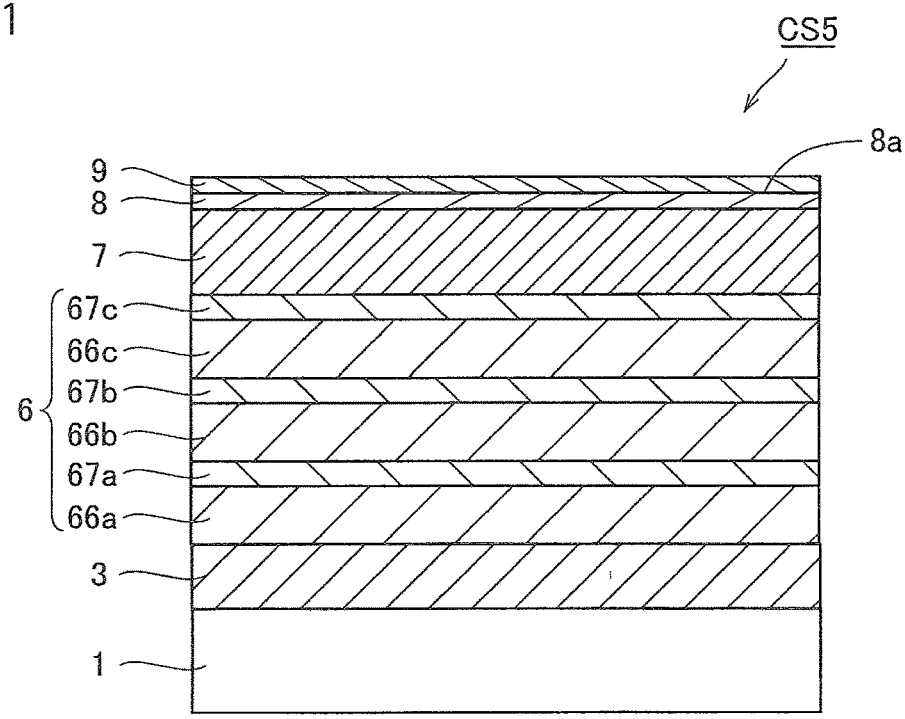
FIG. 11 is a cross-sectional view showing a configuration of compound semiconductor substrate CS5 according to the fifth embodiment of the present invention.

FIG. 11 is a cross-sectional view showing a configuration of compound semiconductor substrate CS5 according to the fifth embodiment of the present invention.

Referring to FIG. 11, the compound semiconductor substrate CS5 according to this embodiment differs from compound semiconductor substrate CS1 in the first embodiment mainly in the internal configuration of nitride semiconductor layer 6. In particular, the nitride semiconductor layer 6 in this embodiment includes GaN layers 66a, 66b and 66c and AlN layers 67a, 67b and 67c. Each of GaN layers 66a, 66b and 66c and AlN layers 67a, 67b and 67c are, for example, 3 layers and are formed alternately. In particular, GaN layer 66a is formed on AlN buffer layer 3 and in contact with AlN buffer layer 3. AlN layer 67a is formed on GaN layer 66a and in contact with GaN layer 66a. GaN layer 66b is formed on AlN layer 67a and in contact with AlN layer 67a. AlN layer 67b is formed on GaN layer 66b and in contact with GaN layer 66b. GaN layer 66c is formed on AlN layer 67b and in contact with AlN layer 67b. AlN layer 67c is formed on GaN layer 66c and in contact with GaN layer 66c. The thickness of each of GaN layers 66a, 66b and 66c is the same. The thickness of each of AlN layers 67a, 67b, and 67c is the same. The thickness of each of GaN layers 66a, 66b and 66c is greater than the thickness of each of AlN layers 67a, 67b and 67c.

The substrate 1 consists of Si, SiC, or the like. On substrate 1, AlN buffer layer 3 is formed in contact with substrate 1. A SiC layer is not formed. As in the first embodiment, if substrate 1 is made of Si, SiC layer 2 may be formed between substrate 1 and AlN buffer layer 3.

Since the configurations of compound semiconductor substrate CS5 other than the above is the same as the configurations of compound semiconductor substrate CS1 in the first embodiment, the same members are given the same numerals, and the description will not be repeated.

According to the present embodiment, as in the first embodiment, source gas of the nitride semiconductor forming cap layer 9 and hydrocarbon gas are introduced into the top surface 8a of barrier layer 8, when forming cap layer 9. As a result, the C concentration of cap layer 9 can be increased while setting the growth temperature of cap layer 9 to a high temperature. As a result, by increasing the C concentration of cap layer 9, the resistance of cap layer 9 can be increased, and gate leakage can be suppressed. Since there is no need to lower the growth temperature of the cap layer, the surface roughness of barrier layer 8 and quality deterioration of cap layer 9 can be suppressed.

Sixth Embodiment

Using each of compound semiconductor substrates CS1 to CS5 in the first to fifth embodiment, for example, a semiconductor device SD having the following configurations may be produced.

Figure 12:
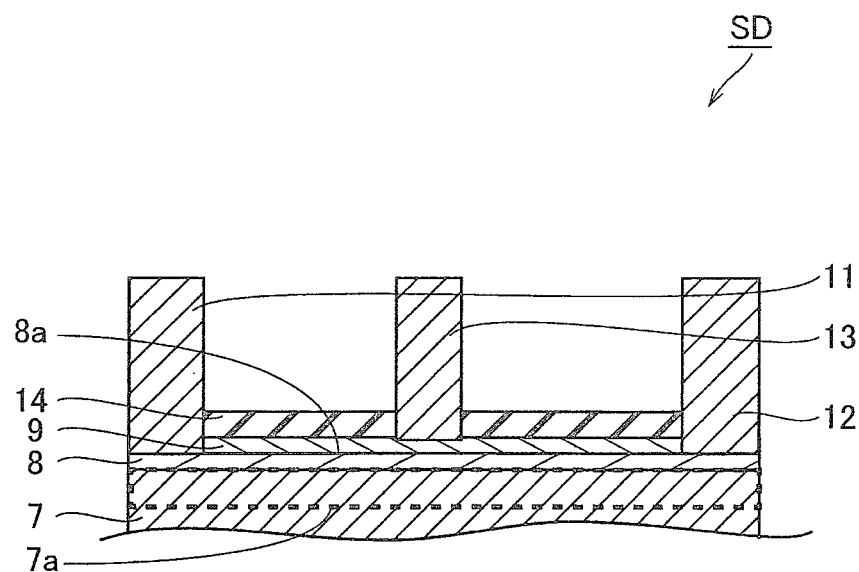
FIG. 12 is a cross-sectional view showing a partial configuration of semiconductor device SD according to the sixth embodiment of the present invention.

FIG. 12 is a cross-sectional view showing a partial configuration of semiconductor device SD according to the sixth embodiment of the present invention.

Referring to FIG. 12, semiconductor device SD in the present embodiment is produced using any one of compound semiconductor substrates CS1 to CS5 in the first to fifth embodiments. Semiconductor device SD includes source electrode 11, drain electrode 12, gate electrode 13, and passivation layer 14, in addition to any one of configurations of compound semiconductor substrates CS1 to CS5. On barrier layer 8, source electrode 11 and drain electrode 12 are provided being spaced apart from each other. The portion of cap layer 9 where source electrode 11 and drain electrode 12 are to be provided on barrier layer 8 has been removed. Between source electrode 11 and drain electrode 12 on cap layer 9, gate electrode 13 is provided. Passivation layer 14 is provided at positions on cap layer 9 where gate electrode 13 is not formed. Passivation layer 14 consists of, for example, $SiO_2$ or SiN. Note that cap layer 9 may not be removed, and source electrode 11 and drain electrode 12 may be provided on cap layer 9.

By applying a voltage between source electrode 11 and drain electrode 12, in semiconductor device SD, electrons move between source electrode 11 and drain electrode 12 via two-dimensional electron gas 7a. The voltage applied to gate electrode 13 changes the concentration of two-dimensional electron gas 7a. For this reason, a voltage applied to gate electrode 13 can realize a switching operation of current flowing between source electrode 11 and drain electrode 12.

In compound semiconductor substrates CS1 to CS5, roughening of top surface 8a of barrier layer 8 is suppressed. This can suppress the gate leak problem in semiconductor device SD, the problem of current collapse becoming degrade can be prevented, and the reliability can be improved. Further, in compound semiconductor substrates CS1 to CS5, cap layer 9 has a high resistance, so the problem of gate leakage in semiconductor device SD can be suppressed.

Examples

As the first Example, the inventors of the present application have produced each of samples 1 to 3 having the configurations described below.

Sample 1 (an example of the present invention): A structure similar to the compound semiconductor substrate CS1 shown in FIG. 1 was fabricated. When forming cap layer 9, a GaN layer intentionally doped with C was formed as cap layer 9 by introducing hydrocarbon gas at a flow rate of 50 sccm as C source gas. The growth temperature of cap layer 9 was set to high temperature. The thickness of cap layer 9 was set to 2.5 nanometers. Electronic traveling layer 7 was formed with GaN, and barrier layer 8 was formed with AlGaN. The growth temperature of barrier layer 8 and cap layer 9 was set to 1030 degrees Celsius.

Sample 2 (a comparative example): As a layer corresponding to cap layer 9 of compound semiconductor substrate CS1 shown in FIG. 1, a GaN layer (u-GaN layer) which was not intentionally doped with C was formed. When forming this cap layer, the growth temperature of the cap layer was set to a high temperature without introducing hydrocarbon as C source gas. The thickness of this cap layer was set to 2.5 nanometers. Electronic traveling layer 7 was formed with GaN, and barrier layer 8 was formed with AlGaN. The growth temperature of barrier layer 8 and the cap layer was set to 1030 degrees Celsius. Otherwise, structures similar to the compound semiconductor substrate CS1 shown in FIG. 1 were fabricated.

Sample 3 (a comparative example): As a cap layer corresponding to cap layer 9 of compound semiconductor substrate CS1 shown in FIG. 1, a GaN layer intentionally doped with C was formed. When forming this cap layer, the growth temperature of the cap layer was lowered without introducing hydrocarbon as C source gas. The thickness of this cap layer was set to 2.5 nanometers. Electronic traveling layer 7 was formed with GaN, and barrier layer 8 was formed with AlGaN. The growth temperature of barrier layer 8 was set to 1030 degrees Celsius. In order to increase the C concentration in the cap layer, the growth temperature of the cap layer was set to less than 800 degrees Celsius. Otherwise, structures similar to the compound semiconductor substrate CS1 shown in FIG. 1 were fabricated.

The inventors of the present application measured the C concentration of the cap layer, measured the surface roughness Rq of the cap layer, and measured the gate leakage current Ig, for each samples obtained.

The C concentration of the cap layer was measured using SIMS (Secondary Ion Mass Spectrometry). Here, in order to perform concentration measurement using SIMS, in principle, the object to be measured as a layer must have a certain thickness (for example, a thickness greater than 100 nanometers). For this reason, for the measurement of the C concentration of the cap layer, alternative samples 1-3 in which the thickness of each cap layer of samples 1-3 was change to 250 nanometers were made, and the measurement was carried out by measuring the C concentration of each of the cap layers of the alternative samples 1-3.

The surface roughness Rq of the cap layer was measured in the following manner. A square region RG (FIG. 4 (b)) having sides of 5 micrometers and containing the center on the top surface of the cap layer was defined. The inside of the region RG was photographed with an AFM (Atomic Force Microscope), and the root mean square height Rq within the region RG was measured based on the photographed image. The root mean square height Rq was measured by the method specified in ISO25178.

Figure 13:
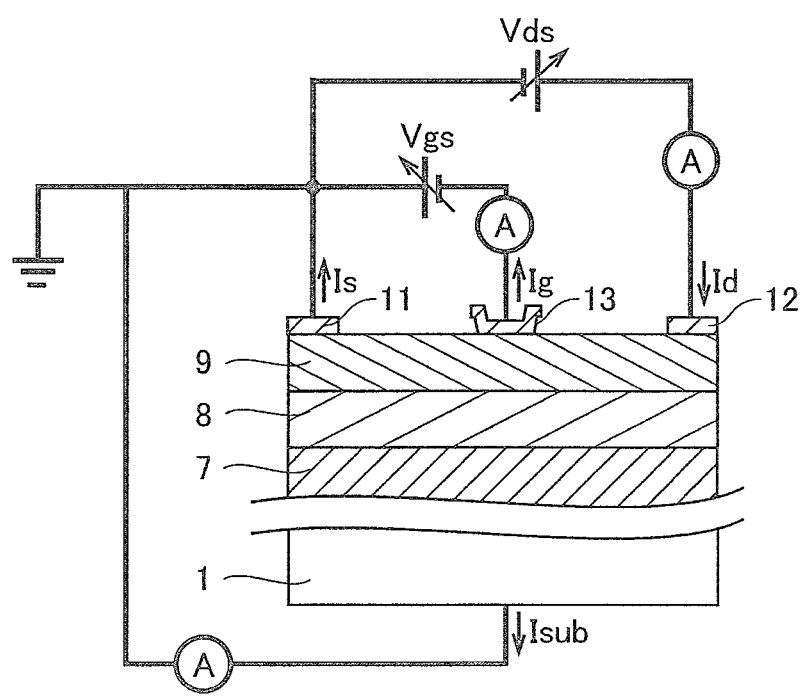
FIG. 13 is a diagram showing a method for measuring the gate leakage current Ig, in the first example of the present invention.

FIG. 13 is a diagram showing a method for measuring the gate leakage current Ig, in the first example of the present invention. Note that FIG. 13 shows a case where an object to be measured is compound semiconductor substrate CS1.

Referring to FIG. 13, source electrode 11, drain electrode 12, and gate electrode 13 are provided being spaced apart from each other on cap layer 9. Source electrode 11 and the reverse side of substrate 1 are grounded. The substrate 1 was then heated to 150 degrees Celsius by placing the substrate 1 on a heating plate not shown in the Figure. Next, while voltage Vds of 650V being applied between source electrode 11 and drain electrode 12, and negative voltage Vgs being applied to gate electrode 13, current Ig flew gate electrode 13 was measured.

In this measurement method, the gate electrode 13 is in an off state, so the current Ig is ideally zero. When the current flowing through the source electrode 11 is current Is, the current flowing through the drain electrode 12 is current Id, the current flowing through the gate electrode 13 (that is, the gate leakage current) is current Ig, and the current flowing through the substrate is current Isub, current Is, current Id, current Ig, and current Isub satisfy the following formula (1).

$$Id = Is + Ig + Isub \tag{1}$$

FIG. 14 is a table showing measurement results of samples 1 to 3 in the first Example of the present invention. FIG. 15 is a diagram showing images within region RG of each of samples 1 and 2 captured by AFM. FIG. 15 (a) is an image of sample 1, and FIG. 15 (b) is an image of sample 2.

Referring to FIGS. 14 and 15, the C concentrations in the cap layers of sample 1 and sample 3 were comparable, and higher than the C concentration in the cap layer of sample 2. According to this result, it can be seen that the cap layer 9 formed by introducing hydrocarbon gas contains the same concentration of C as the cap layer with a lowered growth temperature.

In addition, the surface roughness Rq of each of sample 1 and sample 2 was of the same level and was smaller than the surface roughness Rq of sample 3. According to this result, it can be seen that the surface roughness Rq of the cap layer 9 formed by introducing hydrocarbon gas is improved to the same extent as the surface roughness Rq of the cap layer not intentionally doped with C. From the fact that the surface roughness Rq of the cap layer 9 is improved in the sample 1 as compared to the sample 3, it is presumed that the surface roughness of the barrier layer 8, which is the lower layer of the cap layer 9, is also improved.

Further, the gate leakage current Ig of sample 1 was much smaller than the gate leakage current Ig of sample 2. From this result, it can be seen that the gate leakage is effectively suppressed when the cap layer 9 is formed by introducing hydrocarbon gas.

As second examples, the inventors of the present application manufactured samples 4 to 6 each having the configuration described below.

Sample 4: A compound semiconductor substrate CS1 shown in FIG. 1 was produced. The thickness of each of the C—GaN layers 51a and 51b is about 2 micrometers, and the thickness of the AlN layer 52a is 15 nanometers. The average carbon concentration of each of the C—GaN layers 51a and 51b was set to a value within the range of $3*10^{18}$ atoms/cm$^3$ to $1*10^{20}$ atoms/cm$^3$.

Sample 5: A compound semiconductor substrate CS2 shown in FIG. 5 was produced. The thickness of each of the C—GaN layers 51a, 51b, and 51c was set to about 1 micrometer, and the thickness of each of the AlN layers 52a and 52b was set to 15 nanometers. The average carbon concentration of each of the C—GaN layers 51a, 51b, and 51c was set to a value within the range of $3*10^{18}$ atoms/cm$^3$ or more and $1*10^{20}$ atoms/cm$^3$ or less.

Figure 16:
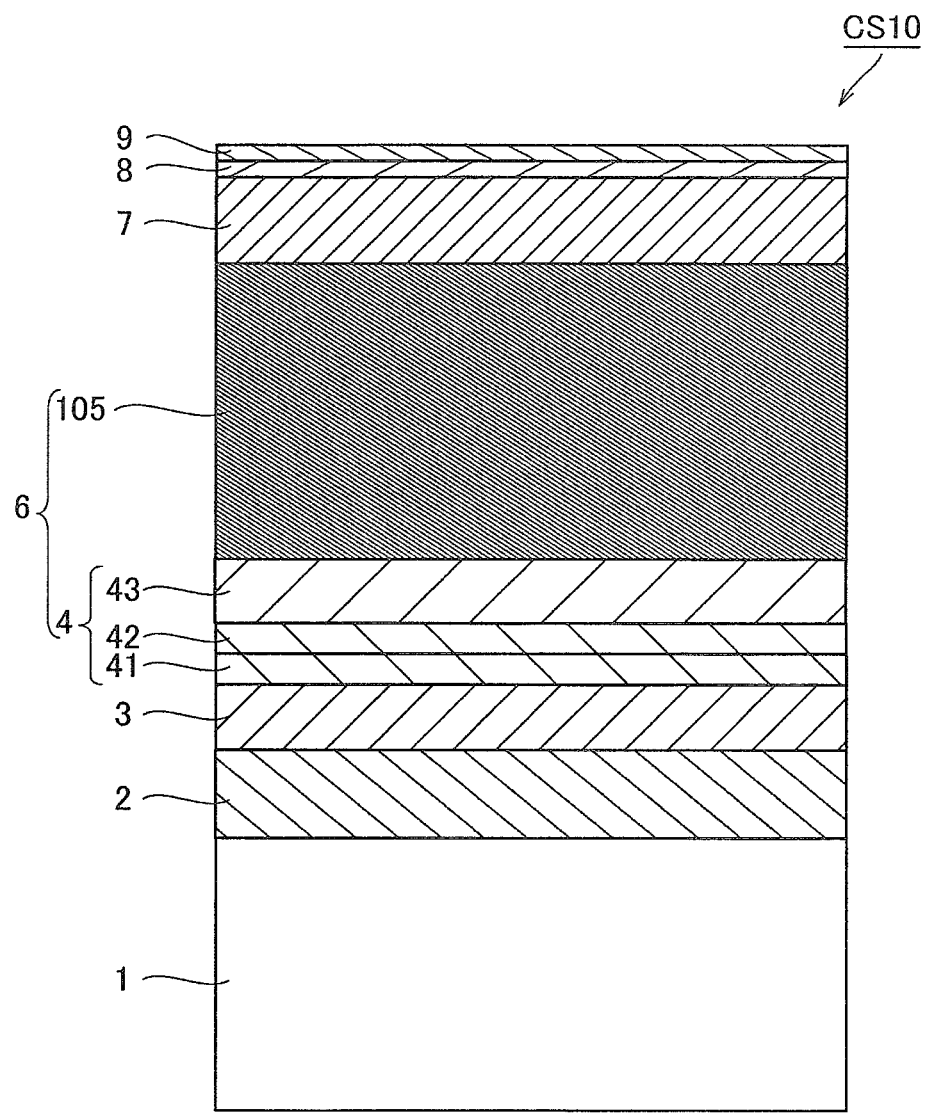
FIG. 16 is a cross-sectional view showing a configuration of compound semiconductor substrate CS10 according to the second example of the present invention.

Sample 6: A compound semiconductor substrate CS10 shown in FIG. 16 was produced. The compound semiconductor substrate CS10 is different from the compound semiconductor substrate CS1 (sample 4) in that C—GaN layer 105 is formed instead of the composite layer 5, and the rest of the configuration is the same as the compound semiconductor substrate CS1 (sample 4). The average carbon concentration of the C—GaN layer 105 was set to a value within the range of $3*10^{18}$ atoms/cm$^3$ to $1*10^{20}$ atoms/cm$^3$.

For each sample obtained, the inventors visually confirmed the presence or absence of cracks, measured the warpage amount, and measured the vertical withstand voltage (the withstand voltage in the thickness direction of the compound semiconductor substrate).

As the vertical withstand voltage, the value was measured with the vertical withstand voltage of sample 6 as a reference (zero). As the warpage amount, when the Si substrate in the compound semiconductor substrate is on the bottom side and the warpage occurs in a convex shape, it was marked as "convex", and when the Si substrate in the compound semiconductor substrate is on the bottom side and the warpage occurred in a concave shape, it was marked as "concave".

As a result, in sample 6, cracks were observed in the region on the outer peripheral side of edge PT2, whereas in samples 4 and 5, cracks were not observed over the entire surface. In all samples 4 to 6, no cracks were observed in the region from center PT1 to edge PT2 (they were crack-free). In sample 6, the warpage amount was large, 146 micrometers in a concave shape, while in sample 4, the warpage amount was small, 43 micrometers in a concave shape. Furthermore, in sample 5, the warpage amount was 27 micrometers in a convex shape. The convex warpage of sample 5 is due to the large compressive strain of the C—GaN layer in the compound semiconductor substrate, indicating that it is highly effective in suppressing the occurrence of cracks. These results show that samples 4 and 5 inhibit the occurrence of cracks and improve the warpage of substrate, as compared to sample 6.

Figure 17:
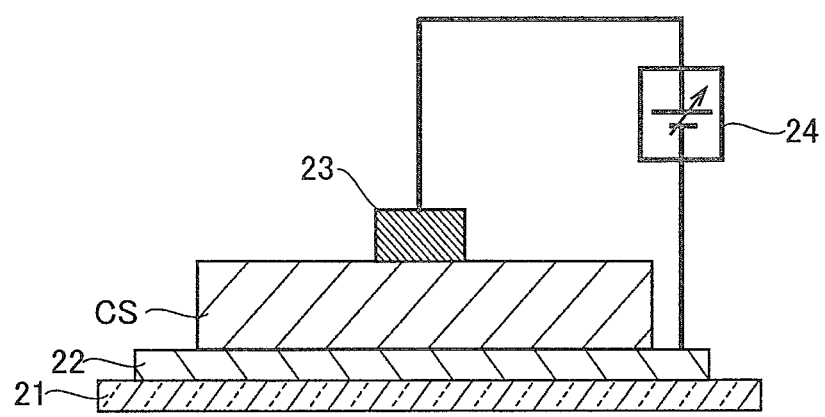
FIG. 17 is a cross-sectional view showing a method of measuring vertical withstand voltage in the second example of the present invention.

FIG. 17 is a cross-sectional view showing a method of measuring vertical withstand voltage in the second example of the present invention.

Referring to FIG. 17, a sample compound semiconductor substrate CS to be measured was fixed on copper plate 22 attached on glass plate 21. An electrode 23 made of Al was provided on the cap layer 9 of the fixed compound semiconductor substrate CS so as to be in contact with the cap layer 9. One terminal of curve tracer 24 was connected to copper plate 22 and the other terminal was connected to electrode 23. A voltage was applied between the copper plate 22 and the electrode 23 using a curve tracer 24, and the density of the current flowing between the copper plate 22 and the electrode 23 (the current flowing in the vertical direction of the sample) was measured. When the measured current density reached $1*10^{-1}$ A/mm$^2$, the sample was considered to reach dielectric breakdown, and the voltage between the copper plate 22 and the electrode 23 at this time was measured as the withstand voltage.

As a result of the measurement, the vertical withstand voltage of sample 4 is 60V higher than that of sample 6. The vertical withstand voltage of sample 5 is 85V higher than that of sample 6. From these results, it can be seen that samples 4 and 5 have improved vertical withstand voltage as compared to sample 6.

As a third example, the inventors produced a compound semiconductor substrate CS6 having a diameter of 6 inches under two manufacturing conditions, obtaining samples 7 and 8, respectively.

Figure 18:
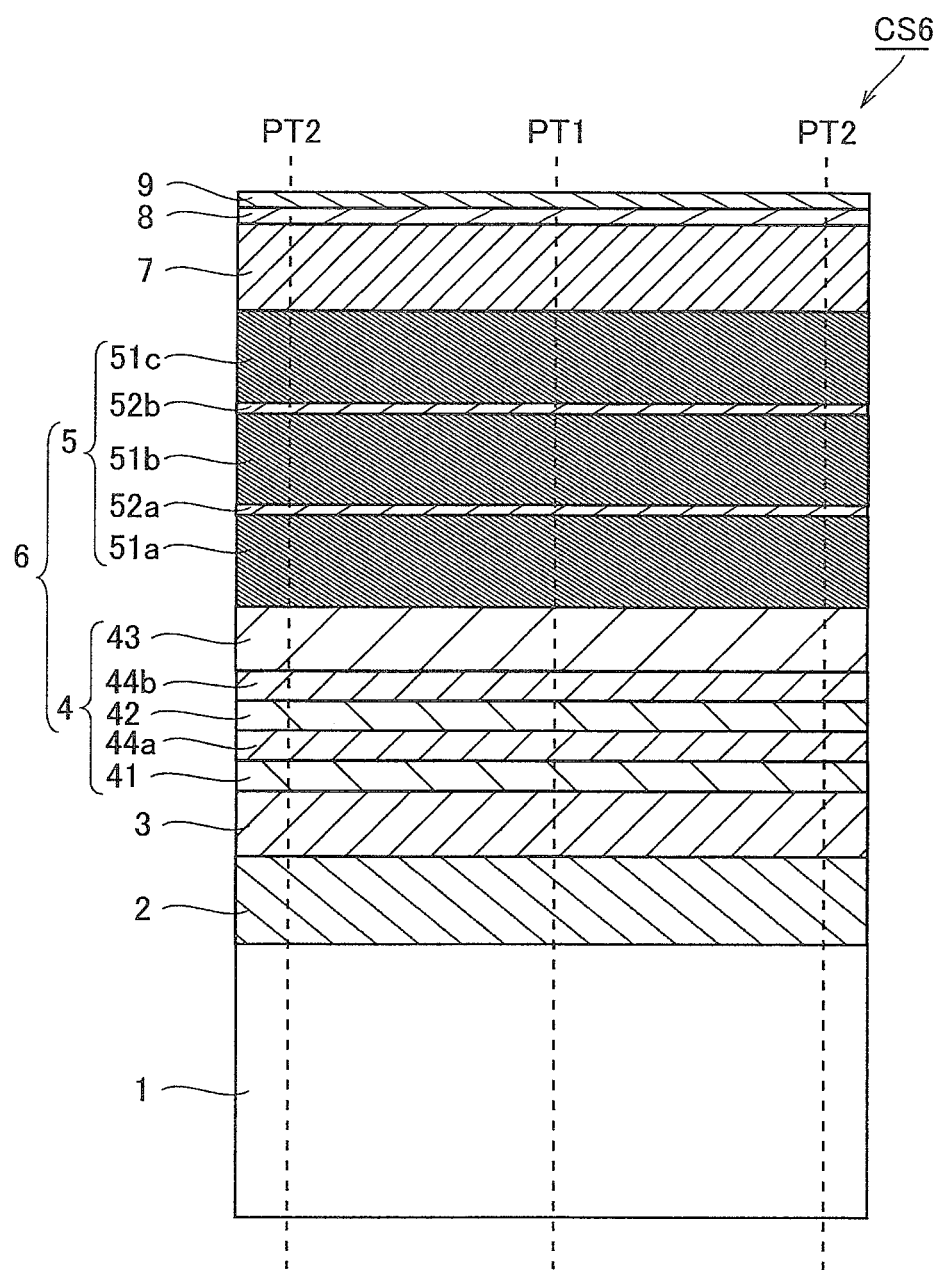
FIG. 18 is a cross-sectional view showing the structure of compound semiconductor substrate CS6 in the third example of the present invention.
Figure 22:
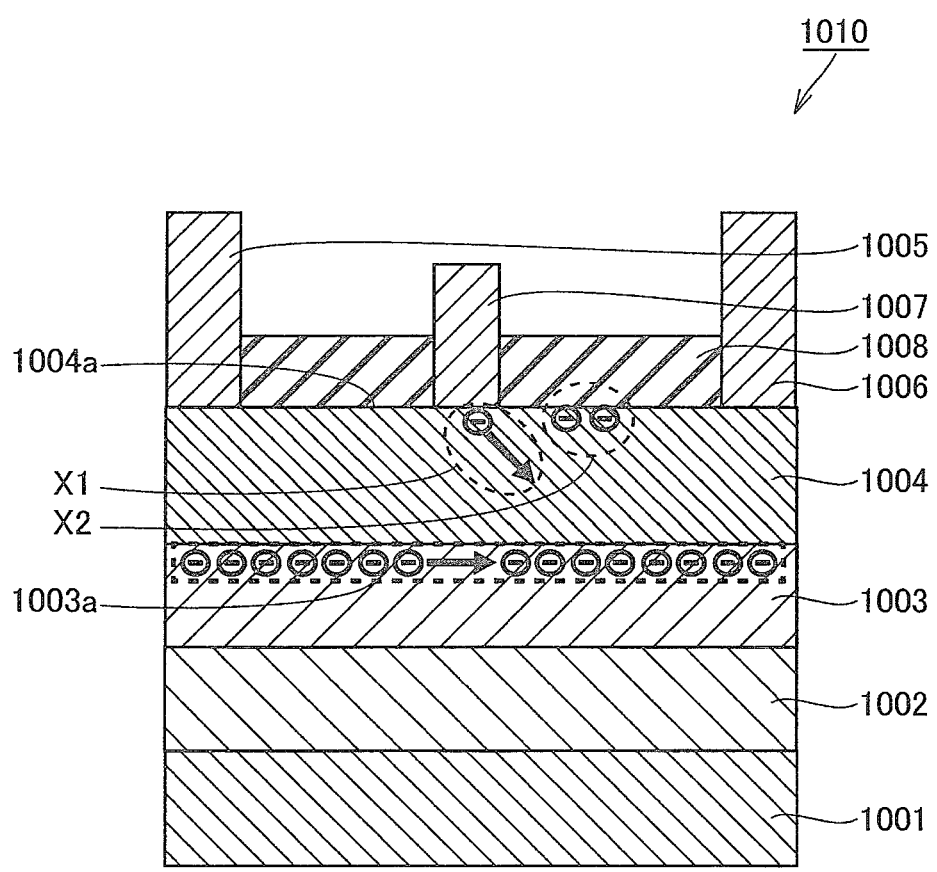
FIG. 22 is a cross-sectional view schematically showing a configuration of a conventional HEMT 1010 consisting of nitride semiconductors.
Figure 23:
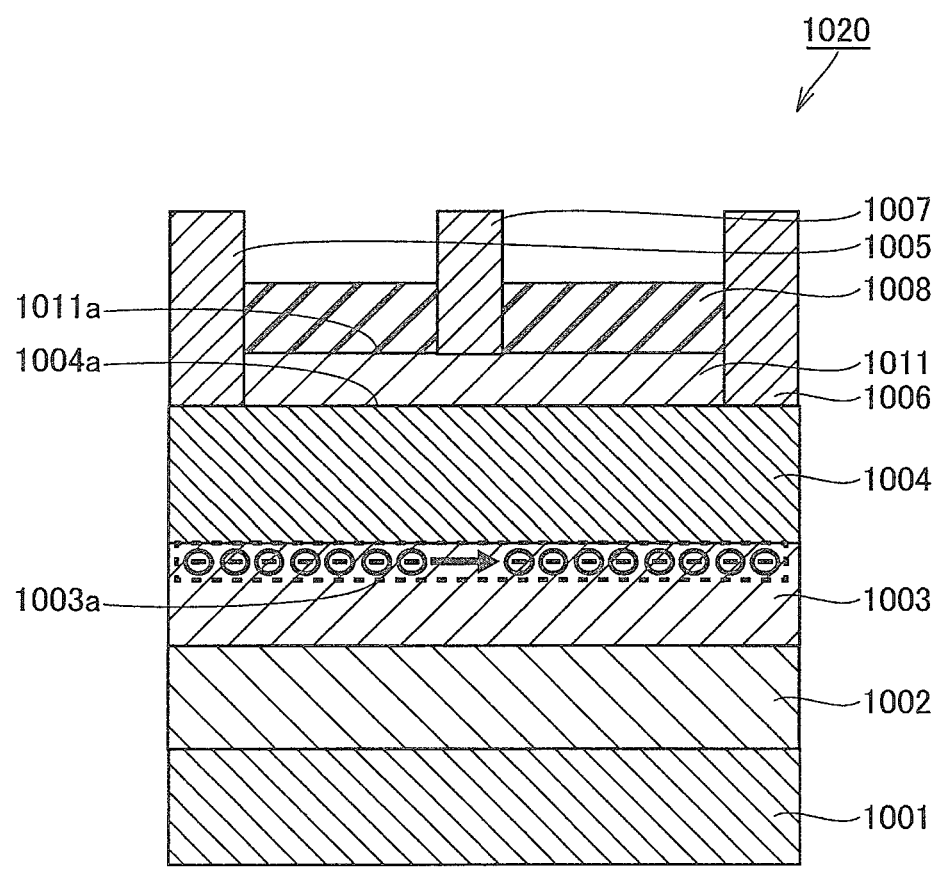
FIG. 23 is a cross-sectional view schematically showing a configuration of conventional HEMT 1020 consisting of nitride semiconductors.

FIG. 18 is a cross-sectional view showing the structure of compound semiconductor substrate CS6 in the third example of the present invention.

Referring to FIG. 18, the structure of compound semiconductor substrate CS6 is the same as that of compound semiconductor substrate CS2 shown in FIG. 5 except for Al nitride semiconductor layer 4. Al nitride semiconductor layer 4 of compound semiconductor substrate CS6 includes $Al_{0.75}Ga_{0.25}N$ layer 41, $Al_{0.5}Ga_{0.5}N$ layer 42, $Al_{0.25}Ga_{0.75}N$ layer 43, and AlN intermediate layers 44a and 44b. The $Al_{0.75}Ga_{0.25}N$ layer 41 is the bottom layer of the Al nitride semiconductor layer 4 and is formed on the AlN buffer layer 3 and in contact with the AlN buffer layer 3. AlN intermediate layer 44a is formed on $Al_{0.75}Ga_{0.25}N$ layer 41 and in contact with $Al_{0.75}Ga_{0.25}N$ layer 41. The $Al_{0.5}Ga_{0.5}N$ layer 42 is formed on the AlN intermediate layer 44a and in contact with the AlN intermediate layer 44a. The AlN intermediate layer 44b is formed on the $Al_{0.5}Ga_{0.5}N$ layer 42 and in contact with the $Al_{0.5}Ga_{0.5}N$ layer 42. The $Al_{0.25}Ga_{0.75}N$ layer 43 is the uppermost layer of the Al nitride semiconductor layer 4 and is formed on the AlN intermediate layer 44b and in contact with the AlN intermediate layer 44b.

In the compound semiconductor substrate CS6, the thickness of substrate 1 is 1000 micrometers, the thickness of SiC layer 2 is 1 micrometer, the thickness of the sum total of AlN buffer layer 3 and Al nitride semiconductor layer 4 is 1 micrometer, the thickness of each of AlN layers 52a and 52b is 15 nanometers, the thickness of electronic traveling layer 7 is 0.5 micrometer, and the thickness of barrier layer 8 is 25 nanometers. The thickness of each of C—GaN layers 51a, 51b, and 51c is set to about 2 micrometers.

Sample 7: When forming each of C—GaN layers 51a, 51b, and 51c, the film forming temperature was set to a high temperature (approximately 200 degrees Celsius lower than the growth temperature of a GaN layer without C doping) and hydrocarbon was introduced as the C source gas.

Sample 8: When forming each of C—GaN layers 51a, 51b, and 51c, the film forming temperature was set to a low temperature (approximately 300 degrees Celsius lower than the growth temperature of a GaN layer without C doping) and no C source gas was introduced.

Subsequently, the inventors of the present application visually confirmed whether cracks occurred or not in compound semiconductor substrate CS6. As a result, cracks did not occur in either sample 7 or sample 8.

Subsequently, the inventors of the present application observed and confirmed the occurrence of meltback etching (a phenomenon in which crystals are altered by the reaction between Si and Ga) to substrate 1 of compound semiconductor substrate CS6 using an optical microscope. As a result, meltback etching did not occur in either sample 7 or sample 8 (Both sample 7 and sample 8 satisfied meltback-free on the entire substrate surface).

Next, for each of C—GaN layers 51a, 51b, and 51c of compound semiconductor substrate CS6, the inventors of the present application determined the carbon concentration distribution in the depth direction at center PT1 and the carbon concentration distribution in the depth direction at edge PT2. SIMS was used for this measurement. Next, concentration C1, which is the carbon concentration at the center position in the depth direction at center PT1 and concentration C2, which is the carbon concentration at the center position in the depth direction at edge PT2 were calculated based on the measured carbon concentration distribution. Next, concentration error ΔC, which is expressed as ΔC (%)=|C1−C2|*100/C1 was calculated based on the calculated concentrations C1 and C2.

FIG. 19 is a diagram showing values of concentration errors ΔC calculated in the third example of the present invention.

Referring to FIG. 19, in sample 7, the range of carbon concentration in the depth direction at center PT1 of each of C—GaN layers 51a, 51b, and 51c is $4*10^{18}$ atoms/cm² or more and $8*10^{18}$ atoms/cm² or less, and the range of carbon concentration in the depth direction at edge PT2 is $4.3*10^{18}$ atoms/cm² or more and $7*10^{18}$ atoms/cm² or less. In sample 7, the carbon concentration at center PT1 and the carbon concentration at edge PT2 are almost the same value, and the concentration error ΔC of each of C—GaN layers 51a, 51b, and 51c is 33%, 21%, and 0%, respectively. The inventors of the present application manufactured a plurality of sample 7 and measured the concentration error ΔC of each of the obtained plurality of sample 7 by the method described above. As a result, in all sample 7, concentration error ΔC was a value within the range of 0 to 50%.

On the other hand, in sample 8, the range of carbon concentration in the depth direction at center PT1 of each of C—GaN layers 51a, 51b, and 51c is $5*10^{18}$ atoms/cm² to $1.5*10^{19}$ atoms/cm², and the range of carbon concentration in the depth direction at edge PT2 is from $2.3*10^{19}$ atoms/cm² to $4.2*10^{19}$ atoms/cm². In sample 8, the carbon concentration at edge PT2 is high as compared to the carbon concentration at center PT1, and the concentration error ΔC of each of C—GaN layers 51a, 51b, and 51c is 448%, 312%, and 258%, respectively.

From the above results, it can be seen that the in-plane uniformity of the carbon concentration in the C—GaN layer is improved in sample 7 compared to sample 8.

Next, the inventors of the present application measured each of the film thickness W1, which is the film thickness at the center PT1, and the film thickness W2, which is the film thickness at the edge PT2, for each of the C—GaN layers 51a, 51b, and 51c of the compound semiconductor substrate CS6. This measurement was performed by observing the cross section of the compound semiconductor substrate CS6 using a TEM (Transmission Electron Microscope). Next, film thickness error ΔW which is expressed by ΔW (%)=|W1−W2|*100/W1 was calculated based on the measured film thicknesses W1 and W2.

FIG. 20 is a diagram showing values of film thickness error ΔW calculated in the third example of the present invention.

Referring to FIG. 20, in sample 7, film thickness error ΔW of each of C—GaN layers 51a, 51b, and 51c was 3.9%, 1.8%, and 1.2%, respectively, all of which were small values. The inventors of the present application manufactured a plurality of sample as samples 7 and measured film thickness error ΔW of each of the obtained plurality of sample 7 by the method described above. As a result, for all samples 7, film thickness error ΔW was a value within the range of 0 to 8%.

On the other hand, in sample 8, film thickness error ΔW of each of C—GaN layers 51a, 51b, and 51c was 9%, 11%, and 11%, respectively, all of which were large values.

From the above results, it can be seen that the in-plane uniformity of the film thickness of the C—GaN layer is improved in sample 7, as compared to sample 8.

Next, the inventors measured the intrinsic breakdown voltage of compound semiconductor substrate CS6. Measurement of the intrinsic breakdown voltage was performed basically by the same method as shown in FIG. 17. As electrode 23, an electrode (specifically, an electrode with a diameter of 0.1 cm) having a sufficiently small area is used, 4 different positions in the surface of cap layer 9 of compound semiconductor substrate CS6 is brought into contact with electrode 23 in order, and the density of the current flowing between copper plate 22 and electrode 23 (current flowing in the vertical direction of the sample) when electrode 23 was brought into contact with each position was measured. When the measured current density reaches $1*10^{-1}$ A/mm², it is assumed that sample has broken down, and the voltage between copper plate 22 and electrode 23 at this time was measured. The highest and lowest values among the obtained four voltages were excluded, and the average value of the remaining two values was taken as the intrinsic breakdown voltage. A plurality of sample were produced as samples 7, and the intrinsic breakdown voltage of each sample was measured. As a result, the intrinsic breakdown voltage of sample 7 was 1200V or more and 1600V or less.

Furthermore, the inventors measured the defect density of the C—GaN layer (an arbitrary C—GaN layer among C—GaN layers 51a, 51b, and 51c) of compound semiconductor substrate CS6 by the following method. First, electrode 23 is brought into contact with 5 different positions near center PT1 on the surface of cap layer 9 in compound semiconductor substrate CS6 in order, and the density of the current flowing between copper plate 22 and electrode 23 (current flowing in the vertical direction of the sample) when electrode 23 was brought into contact with each position was measured. When the measured current density reaches $1*10^{-1}$ A/mm², it is assumed that the sample has broken down, and the voltage between copper plate 22 and electrode 23 at this time is assumed as the insulation breakdown voltage of center PT1. Next, the position where the measured insulation breakdown voltage was 80% or less of the intrinsic insulation breakdown voltage was judged to be the position where the defect was present. The ratio of the number of positions having defects to the five positions where the insulation breakdown voltage was measured was calculated as the defect density D at center PT1.

Calculation of the above-mentioned defect density D at center PT1 was performed using each of the electrodes with four different areas S (0.283 cm², 0.126 cm², 0.031 cm², 0.002 cm²). As a result, four sets of electrode area S and defect density D at center PT1 were obtained.

Next, using formula (2) which is a general Poisson equation showing the relationship among yield Y, electrode area S, and defect density D, yield Y for each of the four different areas S is calculated.

$$Y = \exp(-S*D) \quad (2)$$

Next, the electrode with area S where calculated yield Y is closest to 50% is determined as the optimum electrode for calculating the defect density, and the defect density D corresponding to the optimum electrode area S is adopted as the defect density at center PT1.

The contact position of the electrode 23 was changed to 5 different positions near the edge PT2 on the surface of the cap layer 9, and the defect densities at the edge PT2 were measured in the same manner as described above.

FIG. 21 is a diagram showing defect density values measured in the third example of the present invention.

Referring to FIG. 21, the defect density at center PT1 of sample 7 was 1.8 defects/cm$^2$, and the defect density at edge PT2 of sample 7 was 1.8 defects/cm$^2$. The inventors of the present application manufactured a plurality of samples 7, and measured the defect densities at the center PT1 and edge PT2 of each of the obtained plurality of samples 7 by the method described above. As a result, the defect densities of all sample 7 were within the range of 0 to 7 defects/cm$^2$. On the other hand, the defect density at center PT1 of sample 8 was 207 defects/cm$^2$, and the defect density at edge PT2 of sample 8 was 7.1 defects/cm$^2$.

From the above results, it can be seen that sample 7 has a lower defect density in the GaN layer than sample 8.

[Others]

The configurations and manufacturing methods in above embodiments, modifications and examples can be combined as appropriate.

The configurations in above embodiments, modifications and examples are merely examples. The compound semiconductor substrate according to the present invention may be one that includes an electronic traveling layer consisting of a first nitride semiconductor, a barrier layer formed on the electronic traveling layer and made up of a second nitride semiconductor with a wider band gap than a band gap of the first nitride semiconductor, and a cap layer consisting of a nitride semiconductor formed on the barrier layer and in contact with the barrier layer. A method for manufacturing of a compound semiconductor substrate of the present invention may be any combination of a step forming an electronic traveling layer consisting of a first nitride semiconductor, a step forming a barrier layer consisting of a second nitride semiconductor with a wider band gap than a band gap of the first nitride semiconductor on the electronic traveling layer, and a step forming a cap layer with an organometallic vapor phase epitaxy on the barrier layer and in contact with the barrier layer.

The above-described embodiments, modifications, and examples should be considered illustrative in all respects and not restrictive. The scope of the present invention is shown not by the above description but by the scope of the claims, and is intended to include meanings equivalent to the scope of the claims and all modifications within the scope.

EXPLANATION OF SYMBOLS 1, 1001 substrate (an example of a substrate)
2 SiC (silicon carbide) layer (an example of a SiC layer)
3 AlN (aluminum nitride) buffer layer (an example of a buffer layer)
4 Al (aluminum) nitride semiconductor layer (an example of an Al nitride semiconductor layer)
4a, 4b, 4c, 61, 62, 63, 64 AlGaN (aluminum nitride gallium) layer
5 composite layer (an example of a composite layer)
6 nitride semiconductor layer (an example of a nitride semiconductor layer)
7, 1003 electronic traveling layer (an example of an electrons traveling layer)
7a, 1003a two-dimensional electron gas
8, 1004 barrier layer (an example of barrier layer)
8a, 1004a top surface of a barrier layer
9, 1011 cap layer (an example of a cap layer)
9a, 1011a top surface of a cap layer
11, 1005 source electrode
12, 1006 drain electrode
13, 1007 gate electrode
14, 1008 passivation layer
21 glass plate
22 copper plate
23 electrode
24 curve tracer
41 Al$_{0.75}$Ga$_{0.25}$N layer
42 Al$_{0.5}$Ga$_{0.5}$N layer
43 Al$_{0.25}$Ga$_{0.75}$N layer
44, 44a, 44b AlN intermediate layer
51a, 51b, 51c, 105 C—GaN layer
52a, 52b AlN layer
65 hyperlattice layer
65a, 66a, 66b, 66c GaN (gallium nitride) layer
65b, 67a, 67b, 67c AlN layer
1002 buffer layer
1010, 1020 HEMT (High Electron Mobility Transistor)
CS1, CS2, CS3, CS4, CS5, CS6, CS10 compound semiconductor substrate
PT1 center
PT2 edge
RG area containing a center
SB semiconductor device

What is claimed is:

1. A compound semiconductor substrate comprising:
   an electronic traveling layer consisting of a first nitride semiconductor,
   a barrier layer formed on the electronic traveling layer and consisting of a second nitride semiconductor having a wider band gap than a band gap of the first nitride semiconductor, and
   a cap layer consisting of a nitride semiconductor formed on the barrier layer and in contact with the barrier layer, wherein
   the cap layer has a C concentration of $5*10^{17}$ atoms/cm$^3$ or more and $1*10^{20}$ atoms/cm$^3$ or less, and
   when a square area that is an area containing a center of a top surface of the cap layer and has a side of 5 micrometers is defined, root mean square height Rq in the area is greater than 0 and less than or equal to 1.0 nanometer, wherein
   the barrier layer consists of Al$_e$Ga$_{1-e}$N ($0.17 \leq e \leq 0.27$), and
   the cap layer consists of Al$_g$Ga$_{1-g}$N ($0 \leq g \leq 0.15$).

2. The compound semiconductor substrate according to claim 1, wherein:
   the barrier layer consists of Al$_e$Ga$_{1-e}$N ($0.19 \leq e \leq 0.22$), and
   the cap layer consists of Al$_g$Ga$_{1-g}$N ($0 \leq g \leq 0.08$).

3. The compound semiconductor substrate according to claim 2, wherein:
   the cap layer is made of GaN.

4. The compound semiconductor substrate according to claim 1, further comprising:
   a substrate,
   a buffer layer containing AlN formed on the substrate, and
   a nitride semiconductor layer formed on the buffer layer, wherein
   the electronic traveling layer is made of GaN and formed on the nitride semiconductor layer, and
   the barrier layer consists of a nitride semiconductor containing Al.

5. The compound semiconductor substrate according to claim 4, wherein
the substrate consists of Si, and
the compound semiconductor substrate further comprising a SiC layer formed between the substrate and the buffer layer; and
the nitride semiconductor layer includes:
an Al nitride semiconductor layer made of a material represented by $Al_aGa_{1-a}N$ (0<a≤1) formed on the buffer layer, and
a composite layer formed on the Al nitride semiconductor layer, and
the composite layer includes:
stacked multiple GaN layers, and
one or more AlN layer(s) formed between the multiple GaN layers, and
the uppermost GaN layer among the multiple GaN layers has a C concentration higher than a C concentration of the electronic traveling layer.

6. A method for manufacturing of a compound semiconductor substrate comprising:
a step forming an electronic traveling layer consisting of a first nitride semiconductor,
a step forming a barrier layer consisting of a second nitride semiconductor having a wider band gap than a band gap of the first nitride semiconductor on the electronic traveling layer, and
a step forming a cap layer with an organometallic vapor phase epitaxy on the barrier layer and in contact with the barrier layer, wherein
the cap layer has a C concentration of $5*10^{17}$ atoms/cm$^3$ or more and $1*10^{20}$ atoms/cm or less, and consists of a nitride semiconductor, and
the step forming the cap layer introduces source gas of the nitride semiconductor forming the cap layer and hydrocarbon gas onto a top surface of the barrier layer.

7. The method for manufacturing of the compound semiconductor substrate according to claim 6, wherein:
the step forming the electronic traveling layer forms the electronic traveling layer on a substrate,
a temperature of the substrate is a first temperature at the step forming the barrier layer,
a temperature of the substrate is a second temperature at the step forming the cap layer, and
when a third temperature is 25 degrees Celsius lower than the first temperature, the second temperature is higher than the third temperature.

8. The method for manufacturing of the compound semiconductor substrate according to claim 7, wherein:
the second temperature is equal to the first temperature.

* * * * *